United States Patent
Ho et al.

(10) Patent No.: US 7,193,262 B2
(45) Date of Patent: Mar. 20, 2007

(54) LOW-COST DEEP TRENCH DECOUPLING CAPACITOR DEVICE AND PROCESS OF MANUFACTURE

(75) Inventors: Herbert L. Ho, New Windsor, NY (US); John E. Barth, Jr., Williston, VT (US); Ramachandra Divakaruni, Ossining, NY (US); Wayne F. Ellis, Jericho, VT (US); Johnathan E. Faltermeier, Fishkill, NY (US); Brent A. Anderson, Jericho, VT (US); Subramanian S. Iyer, Mount Kisco, NY (US); Deok-Kee Kim, Wappingers Falls, NY (US); Randy W. Mann, Poughquag, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/905,094

(22) Filed: Dec. 15, 2004

(65) Prior Publication Data
US 2006/0124982 A1    Jun. 15, 2006

(51) Int. Cl.
*H01L 29/94* (2006.01)
*H01L 29/00* (2006.01)

(52) U.S. Cl. .............. 257/304; 257/516; 257/E27.093
(58) Field of Classification Search .............. 257/304, 257/E27.093, 516
See application file for complete search history.

(56) References Cited

U.S. PATENT DOCUMENTS

| 5,606,188 | A | * | 2/1997 | Bronner et al. ............. 257/301 |
| 5,759,907 | A | | 6/1998 | Assaderaghi et al. |
| 5,770,875 | A | | 6/1998 | Assaderaghi et al. |
| 5,805,494 | A | | 9/1998 | El-Kareh et al. |
| 6,057,188 | A | | 5/2000 | El-Kareh et al. |
| 6,236,079 | B1 | * | 5/2001 | Nitayama et al. ........... 257/306 |
| 6,399,978 | B2 | * | 6/2002 | Gruening et al. ........... 257/301 |
| 2001/0038112 | A1 | * | 11/2001 | Gambino et al. ........... 257/301 |

* cited by examiner

*Primary Examiner*—Matthew Smith
*Assistant Examiner*—Lex H. Malsawma
(74) *Attorney, Agent, or Firm*—Scully, Scott, Murphy & Presser, P.C.; H. Daniel Schnurmann

(57) ABSTRACT

A novel trench-type decoupling capacitor structure and low-cost manufacturing process to create trench decoupling capacitors (decaps). In a unique aspect, the invention necessitates the addition of only a simplified trench to a base logic design.

16 Claims, 19 Drawing Sheets

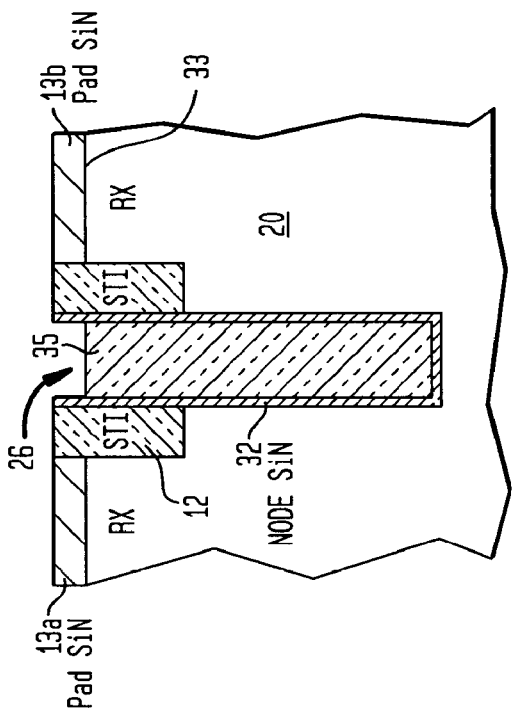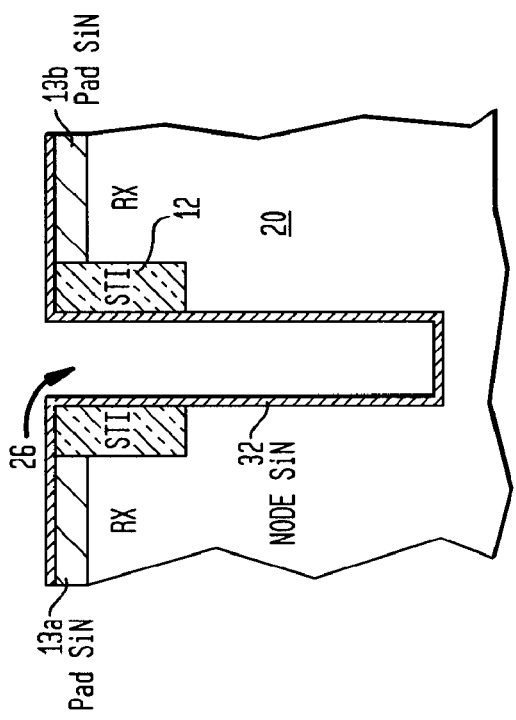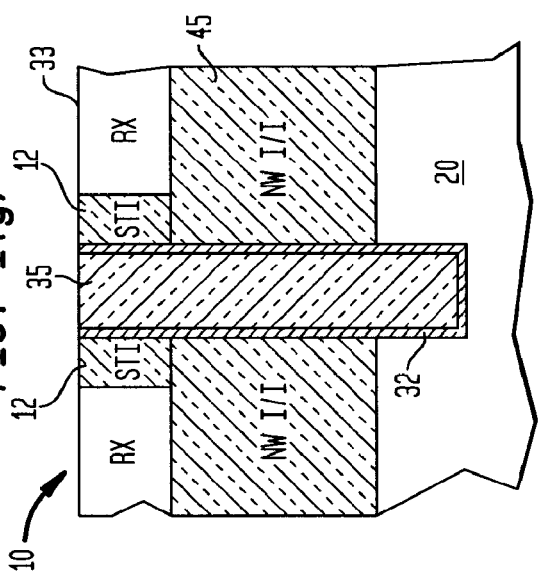

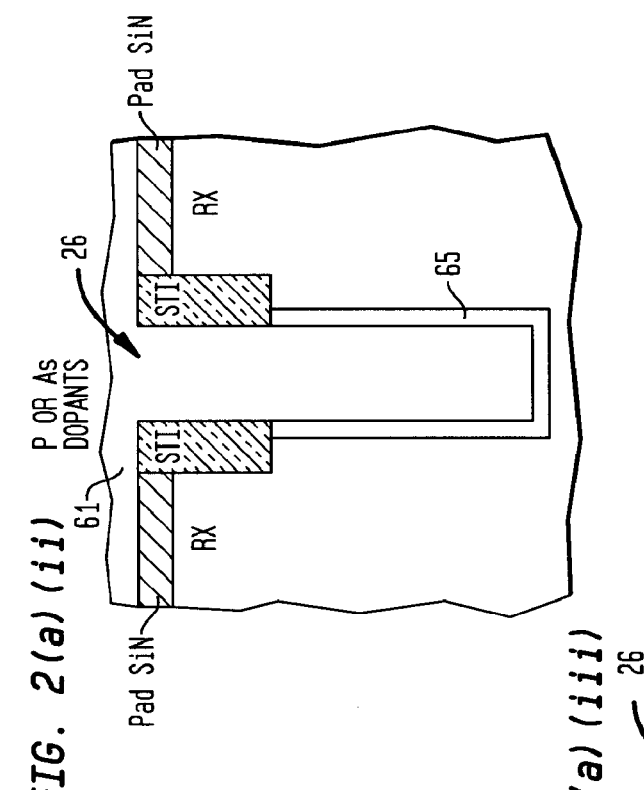
FIG. 2(a)(i)
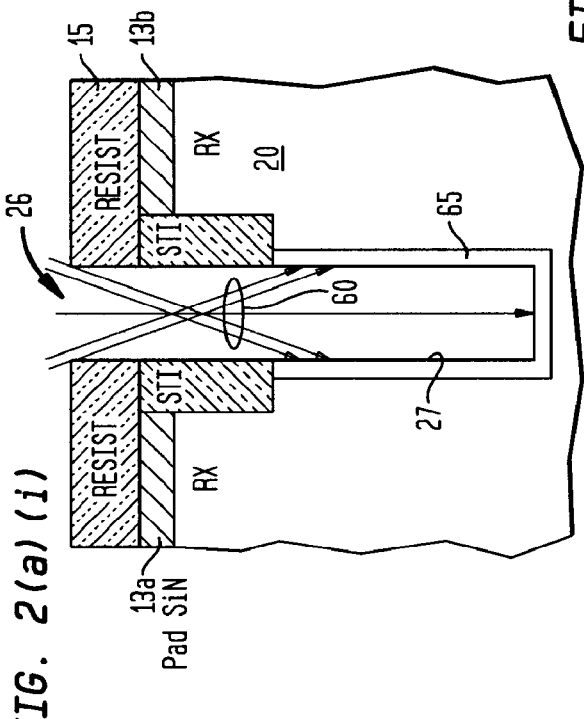
FIG. 2(a)(ii)
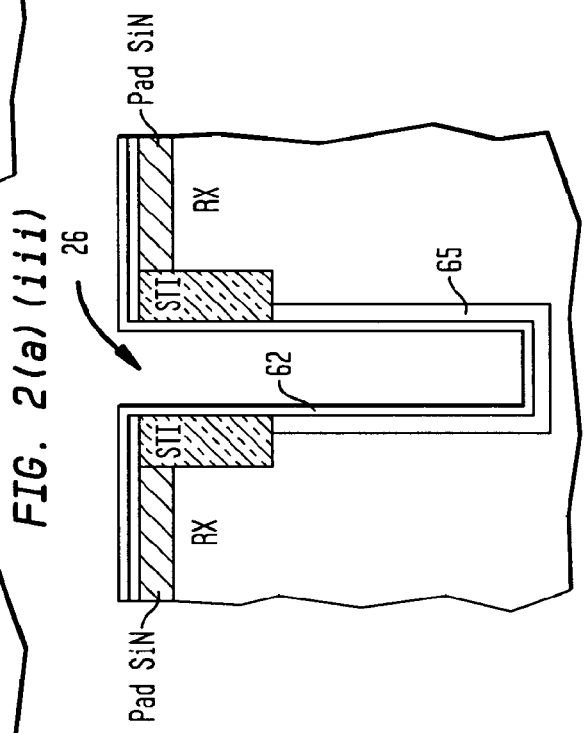
FIG. 2(a)(iii)

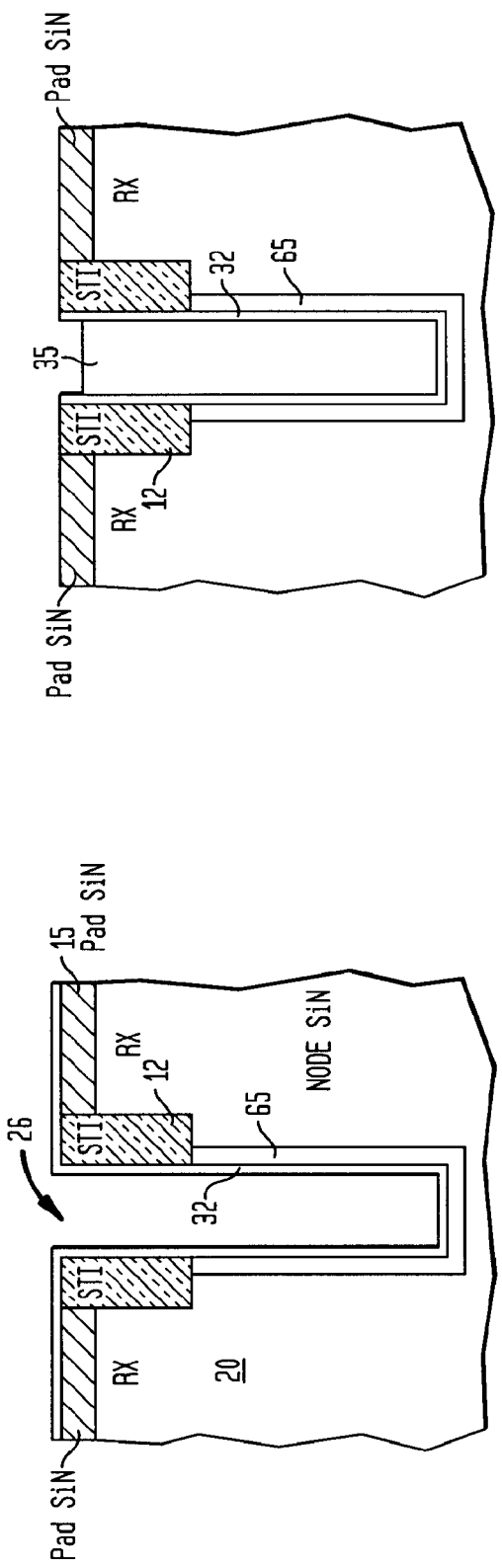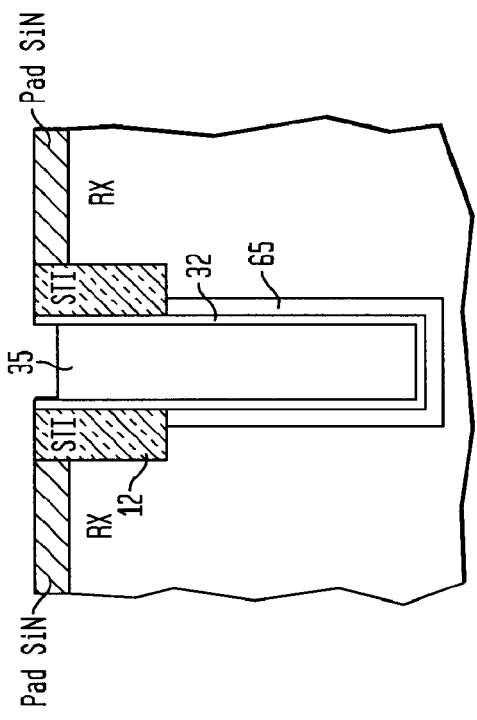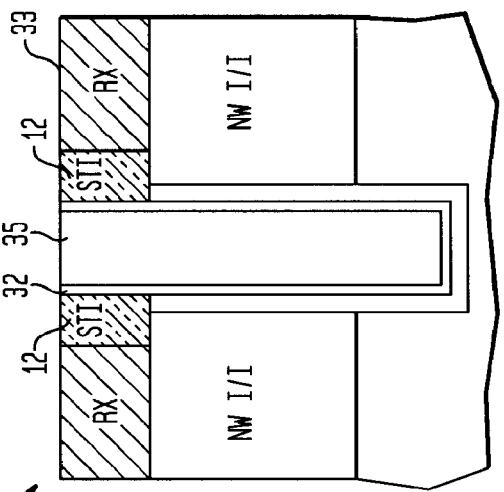

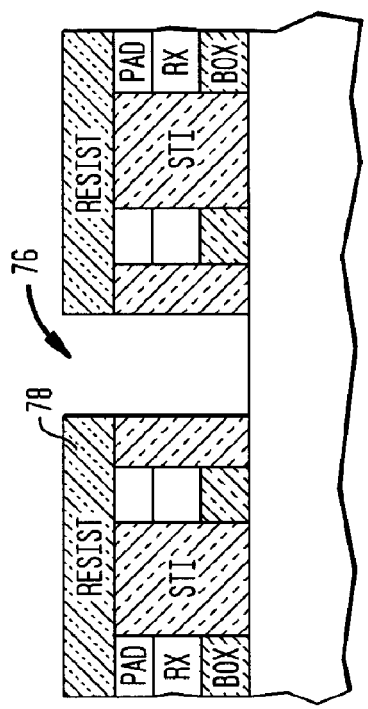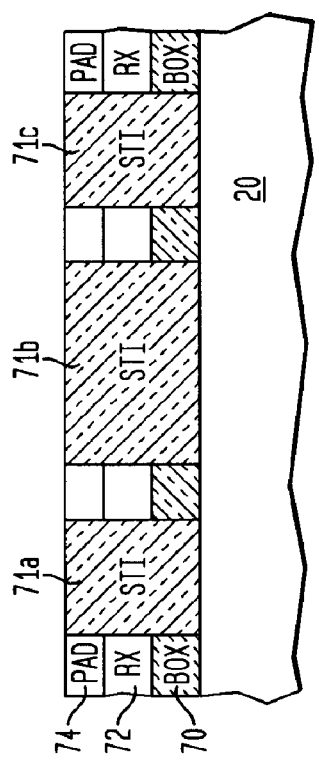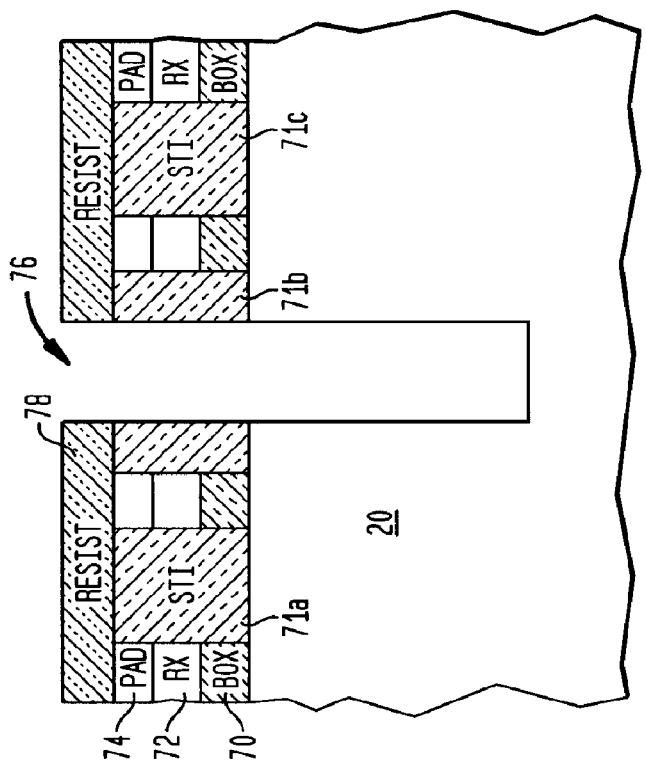
FIG. 3(a)
FIG. 3(b)
FIG. 3(c)

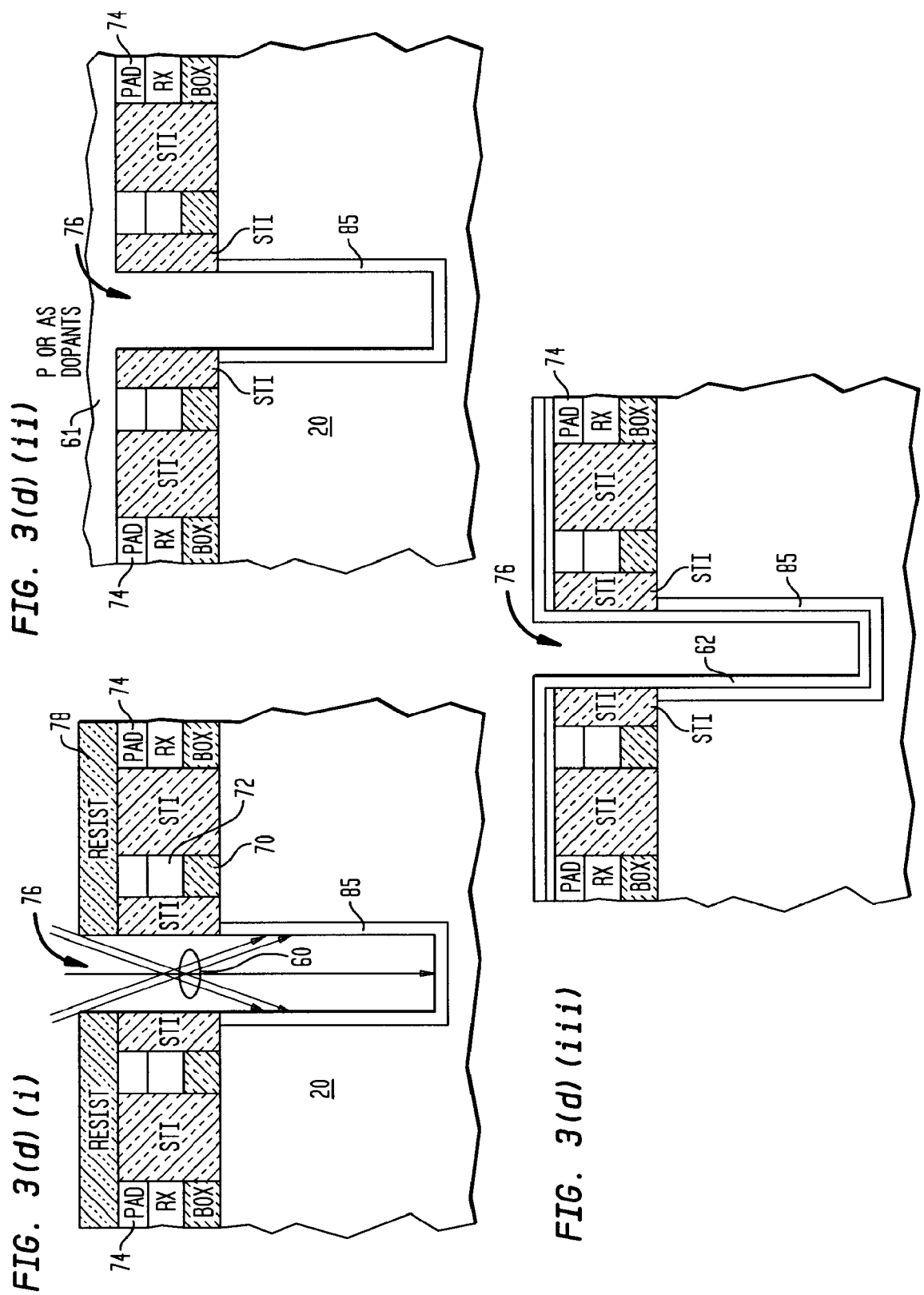

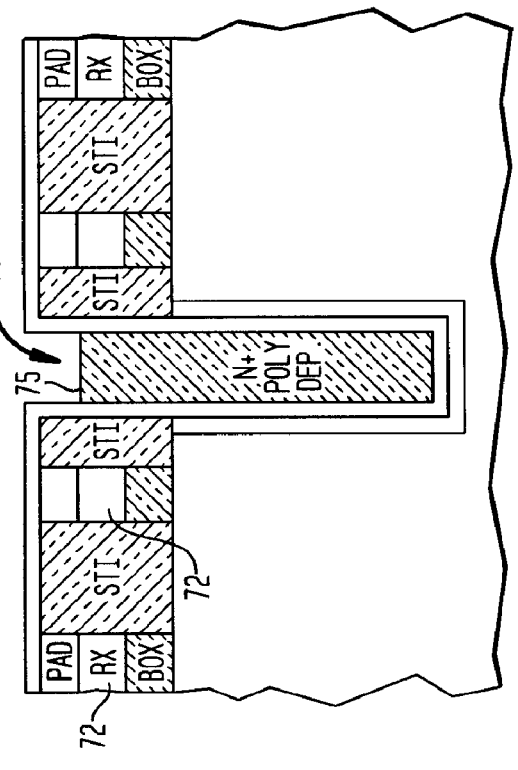
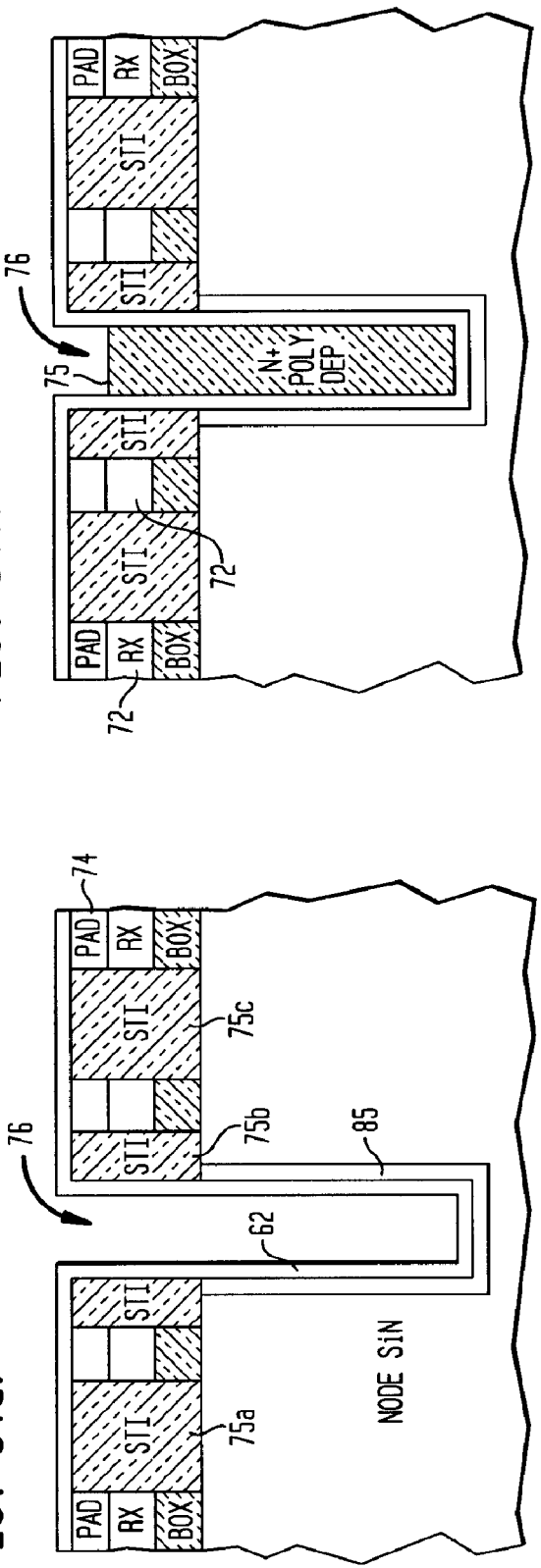
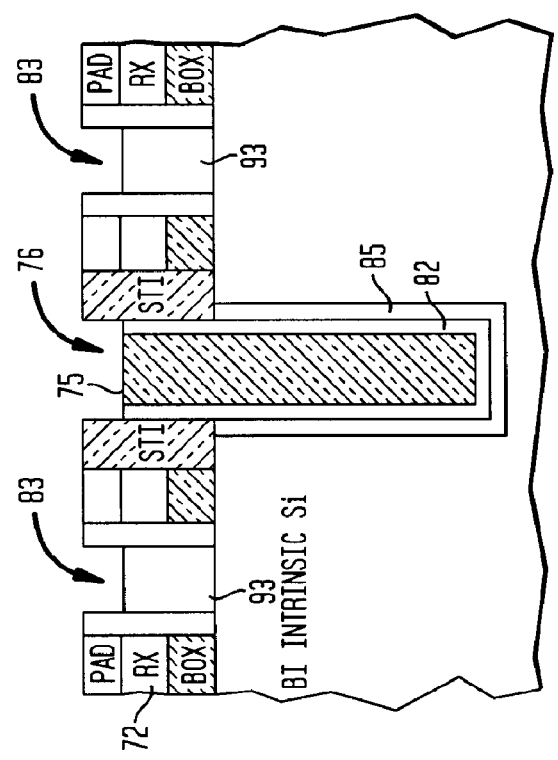
FIG. 3(e)
FIG. 3(f)
FIG. 3(g)

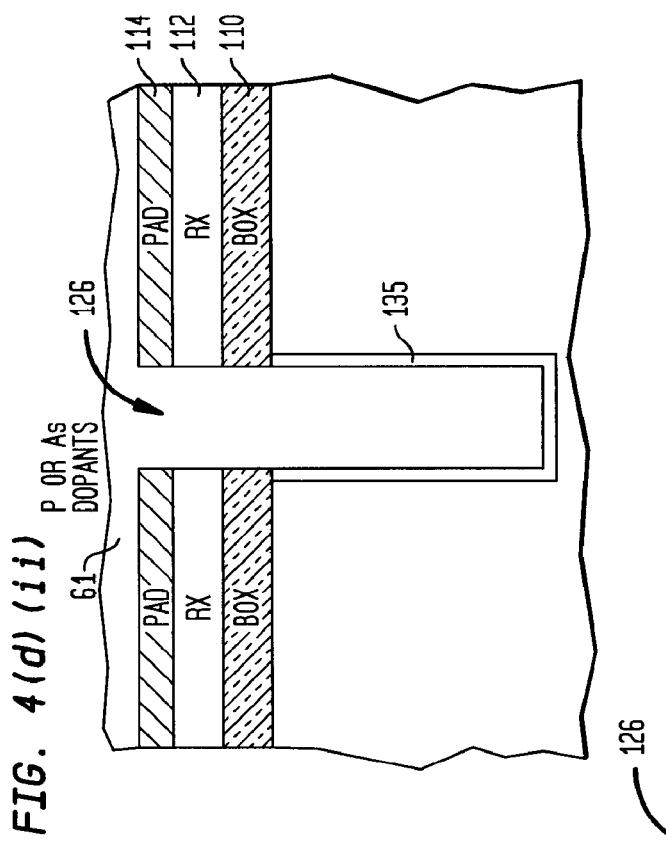
FIG. 4(d)(i)
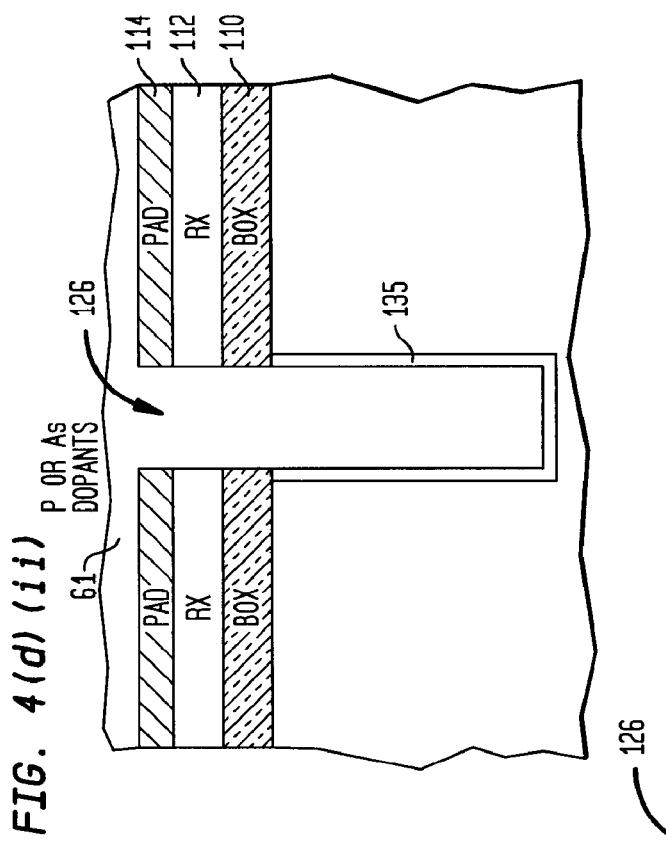
FIG. 4(d)(ii)
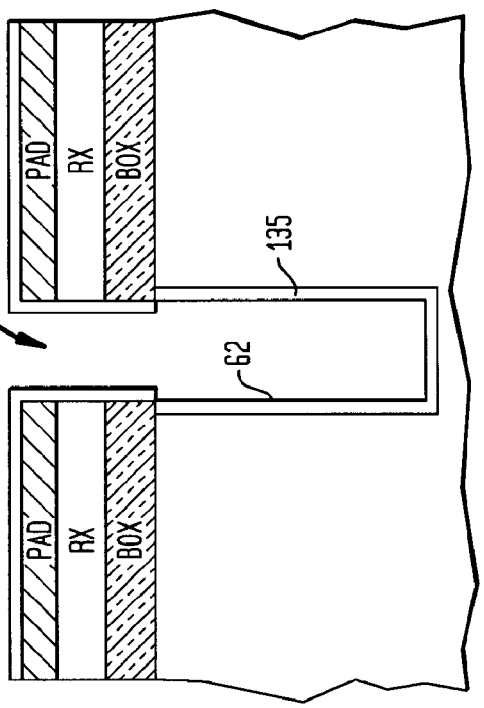
FIG. 4(d)(iii)

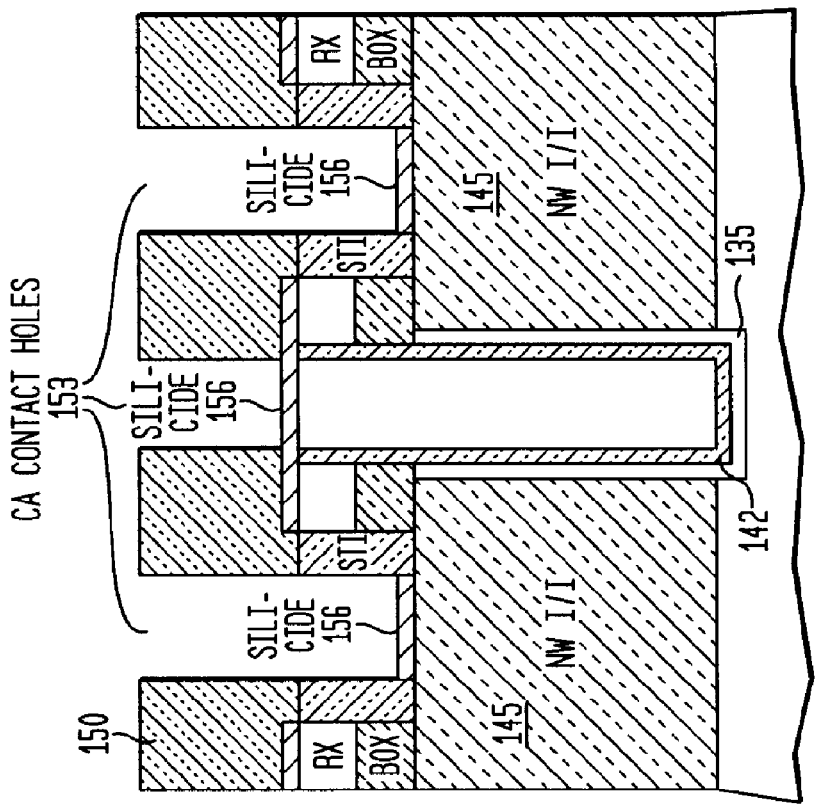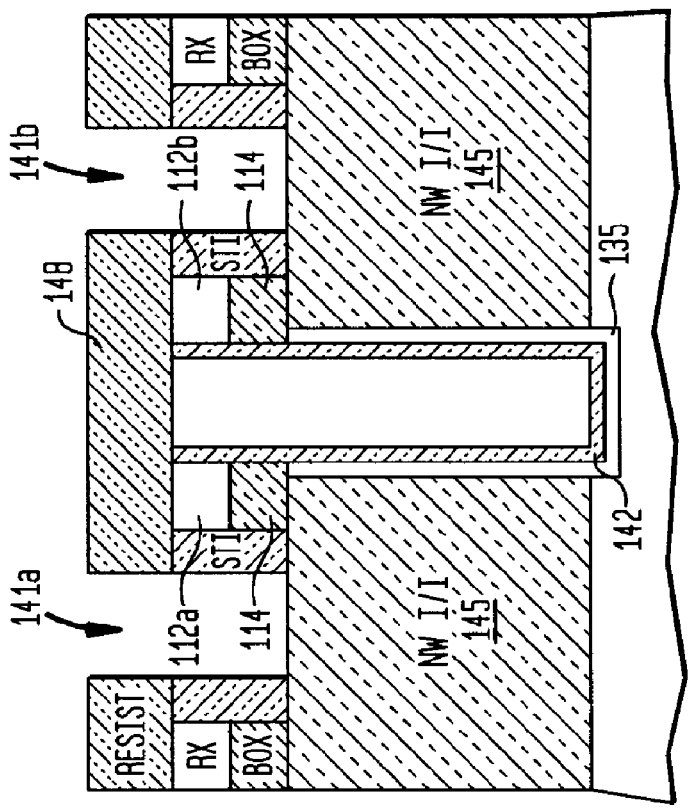

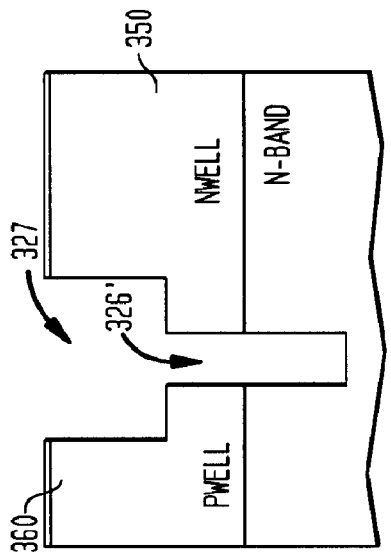
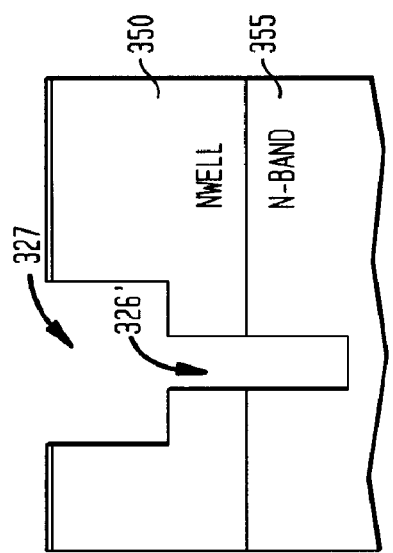
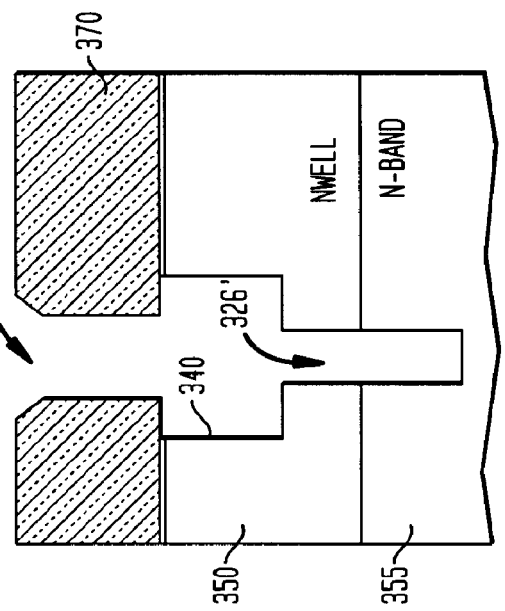

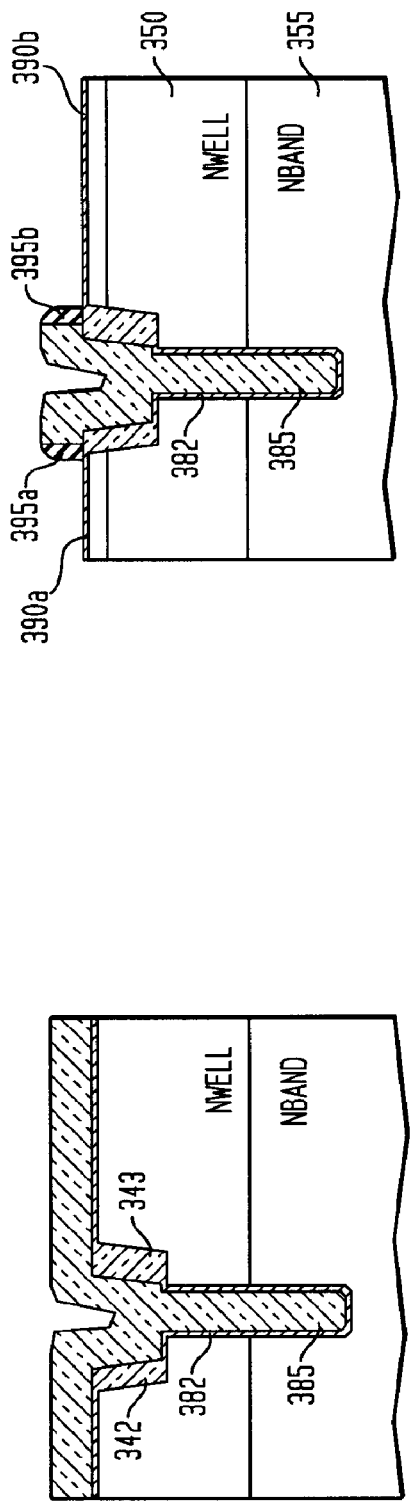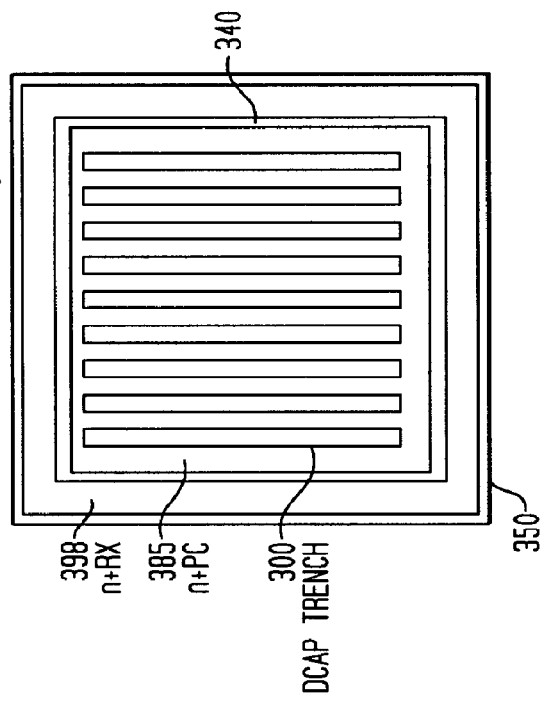

LOW-COST DEEP TRENCH DECOUPLING CAPACITOR DEVICE AND PROCESS OF MANUFACTURE

BACKGROUND OF THE INVENTION

Field of the Invention

The present invention relates generally to the fabrication of semiconductor circuit chips, and more particularly to a novel trench-type decoupling capacitor for a semiconductor circuit and cost-effective process for manufacturing trench-type decoupling capacitors.

In 90 nm and 65 nm integrated circuit chip designs, noise-related issues are of paramount concern. Logic noise can lead to degraded circuit speeds, and at the worst case, chip failure. On-chip decoupling capacitors (commonly referred to as "decaps") are typically used to prevent noise-related circuit degradation. However, decaps that are typically offered are large planar (polygate) capacitors that are created on thin oxides. There are three problems inherent with planar decaps. First, planar capacitors end up taking a lot of a space on a chip. As designs increasingly get larger and more complex, it will be necessary to add more decaps to the design which only fuels the desire to add more decaps to the chip. Second, large decap densities can wreak havoc on polygate linewidth control (i.e., Across Chip Linewidth Variation, ACLV). The amount of polysilicon gate conductors that needs to be etched on a wafer—also referred to as "loading"—has a direct impact on how the line etches. The more gate polysilicon one is required to etch, the higher the chances of poorer linewidth control. This unpleasant result leads to transistor degradation and device performance loss. The third, and most disconcerting problem with planar decaps, is the leakage through the thin oxide themselves. Gate leakage—primarily electron tunneling—is becoming a major concern and using more planar decaps on-chip would only aggravate the power consumption conundrum.

One present solution to the planar decaps is to use a trench-type capacitor as a decap. Since the trench is made directly in the silicon wafer and the sidewalls of the trench are used for the capacitor dielectric, the planar area of trench decaps can be made fairly small. Second, as the trenches are processed prior to the polygate conductor module, there is no issue of trench decaps causing ACLV problems. The main detractor of using a trench capacitor approach as a decap is the process complexity and cost. Since it takes a considerable amount of time to make a trench capacitor, the cost of adding a trench capacitor to a non-eDRAM chip design makes the implementation of trench decaps in SF designs cost prohibitive.

If trench capacitors could be made cheaper, it could undoubtedly be used in chip designs as a decap.

It would be highly desirable to provide a cost-effective manufacturing technique for the production of decoupling capacitors (decaps) in semiconductor chip designs.

SUMMARY OF THE INVENTION

This invention addresses directly the cost issue of manufacturing trench-type capacitors functioning as IC decoupling capacitor devices.

According to the invention, there is provided a novel decoupling capacitor structure and low-cost manufacturing process to create trench decoupling capacitors (decaps). In a unique aspect, the invention necessitates the addition of only a simplified trench to a base logic design, e.g., the addition of one (1) mask to a base logic process.

There are two distinct embodiments of the "low-cost" trench decap processes according to the invention. The first embodiment describes a process flow whereby the doping level of the silicon substrate regions immediately adjacent to the trench (i.e. the outer electrode of the decap) is provided by logic N-type ion implant (i.e., an N-well). This process would be the least costly of the two, however, requires specific voltage conditions to be made workable. For example, this process would require either: (1) about a 3 mm space between neighboring N-wells; or, (2) an isolation P-well structure surrounding the N-well.

The second embodiment of the process, although slightly more expensive, describes several ways to heavily dope the silicon substrate adjacent to the trench. The presence of the high doping level provides more flexibility in terms of voltage conditions that can be applied to the decap and also allows for capacitors to be placed virtually anywhere in a design if biased properly.

The two processes share the common physical structure in that a "shallow" deep trench is processed within an STI structure. Here, the trench process is performed after the STI is physically patterned and filled; this process is opposite to "eDRAM" processing where the capacitors are formed prior to STI. In addition, the number of processes to fabricate the "shallow" trench decap is greatly reduced compared to the eDRAM capacitors. Indeed, it is estimated that the "shallow" trench decap would increase a base (non-eDRAM) wafer cost by only about 5–7%.

Further embodiments for a decap structure and manufacturing process therefore include the fabrication on SOI structure, for example, the formation in a silicon substrate having a buried insulator layer, e.g., a buried oxide (BOX) layer.

BRIEF DESCRIPTION OF THE DRAWINGS

The objects, features and advantages of the present invention will become apparent to one skilled in the art, in view of the following detailed description taken in combination with the attached drawings, in which:

FIGS. 1(a)–1(i) illustrate process steps for fabricating the low-cost shallow trench decap structure according to a first embodiment of the invention;

FIGS. 2(a)–2(f) illustrate process steps for fabricating the low-cost shallow trench decap structure according to a second embodiment of the invention;

FIGS. 3(a)–3(j) illustrate process steps for fabricating the low-cost shallow trench decap structure according to a third embodiment of the invention;

FIGS. 4(a)–4(j) illustrate process steps for fabricating the low-cost shallow trench decap structure according to a fourth embodiment of the invention;

FIGS. 5(a)–5(h) depict an additional embodiment for forming a decap 300 of the present invention according to a base logic process consistent with and compatible with existing logic processing methods and tool set; and, FIG. 5(i) depicts a conceptual top view schematic of a resultant formed decap trenches 300 pointing downward into the silicon to form a high capacitance structure in a small area.

DETAILED DESCRIPTION OF THE PREFERRED EMBODIMENTS

In both embodiments of the shallow trench decap structure and process of the invention, patterning of the active Si islands is first conducted. Here, the Shallow Trench Isolation (STI) dielectric, e.g., an oxide, nitride, oxynitride material or like materials of about 300 nm–400 nm thick, provides isolation for the two contacts that need to bias the inner and outer electrode of the DT decap. Preferably, the STI region comprises an oxide insulator such as low pressure TEOS (tetraethylorthosilicate), High Density Plasma (HDP) oxide or, like oxide. The STI oxide is also used as a hardmask to facilitate silicon trench etching of 2 μm–3 μm. One concern of making the trench in STI is whether the resist mask would be robust enough to withstand the (STI) oxide RIE and Si RIE processes. To circumvent this problem, a borosilicate glass (BSG) hardmask may be deposited according to like processes implemented in forming the eDRAM trench. Since the trench depth is reduced 2X–3X, and since the STI dielectric (oxide) is also used as a hardmask, the maximum BSG thickness would need to be on the order of about 100 nm–200 nm. In addition, the STI oxide should not be adversely impacted when the BSG is removed since etch selectivity of BSG to oxide is 200:1.

Figure 1A:
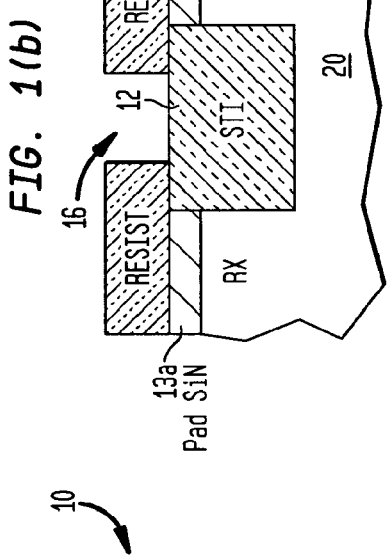
Figure 1B:
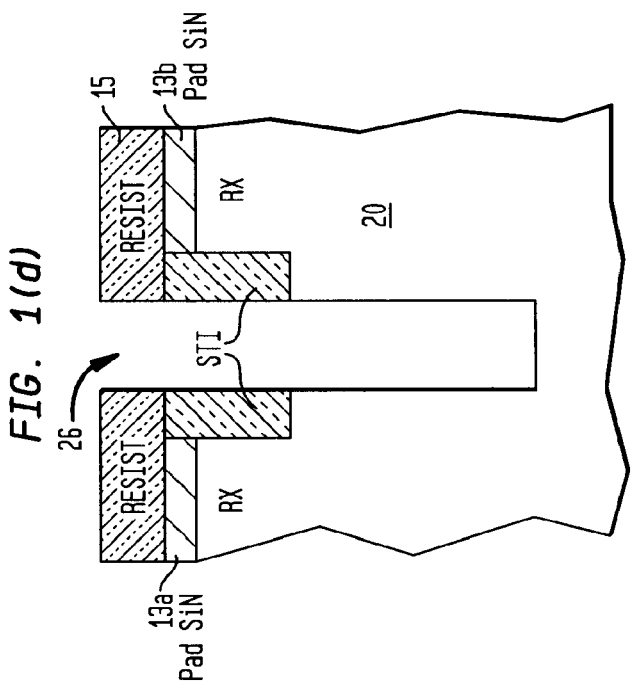
Figure 1C:
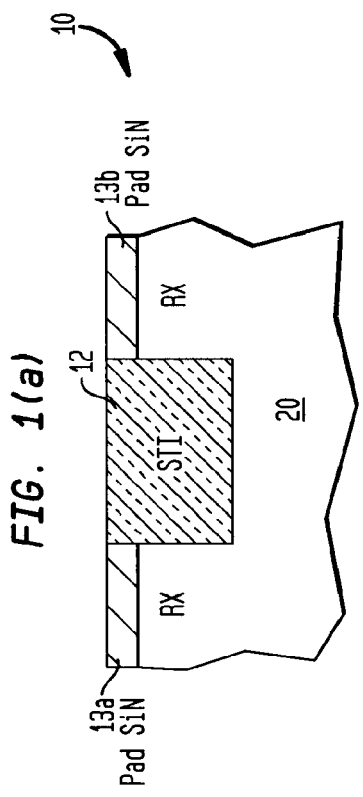

A first embodiment of the shallow trench decap structure 10 and process of the invention, is now described with respect to FIGS. 1(a)–1(i). This first process embodiment according to the invention includes the fabrication of the N-well electrode. As shown in FIG. 1(a), the process includes utilizing a Process of Record (POR) to form an STI region 12 in a Si-containing semiconductor substrate 20. Illustrative examples of Si-containing materials that can be employed as the Si-containing substrate 20 include, but are not limited to: Si, SiGe, SiC, SiGeC, and layered semiconductors such as Si/SiGe, a silicon-on-insulator (SOI) or a SiGe-on-insulator (SGOI). Thus, as shown in FIG. 1(a), an STI region 12 is fabricated in a substrate 20 with two insulator regions 13a, 13b formed on either side of the STI 12. In the embodiment described, the STI width may range between 0.3 μm–0.6 μm and may range in depth from about 2500 Å to 5000 Å. The two insulator regions 13a, 13b are planarized with the surface of the STI and are typically comprised of a pad Nitride (e.g., SiN) of 1000 Å to 2000 Å thick, and a thin oxide layer (e.g., 50 Å to 100 Å thick). As shown in FIG. 1(b), the next step involves etching a trench within the formed STI structure 12. Thus, as shown in FIG. 1(b), a deep trench (DT) resist mask layer is first applied and patterned to form a mask 15 having a capacitor trench etch opening 16 formed over the STI region. Optionally, under the resist mask layer 15, a thin layer of BSG (not shown) or like material layer may first be deposited to serve as a hardmask. This BSG film would be much thinner than the one used for eDRAM processing, e.g., to a thickness ranging between 1 kÅ to 6 kÅ, and can be removed with a high degree of selectivity with respect to the STI dielectric (e.g., oxide). Then, a mask open etch process is applied to form a trench 26 within the STI 12 as shown in FIG. 1(c). While for illustrative purposes an etch having straight profiles is shown in FIG. 1(c), it is understood that a formed trench in the STI may have a taper.

Figure 1D:
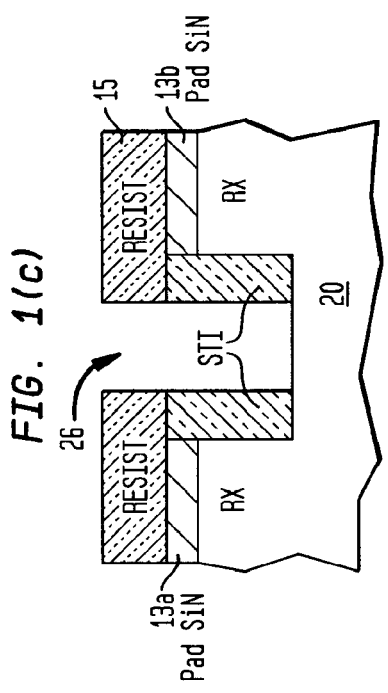

Further, as shown in FIG. 1(d), a DT Si Reactive Ion Etch (RIE) technique is applied to further extend the depth of the trench 26 below the STI bottom in the Si substrate 20 to a target depth of, for example, 1 μm–3 μm according to the invention. After the trench 26 is etched, as shown in FIG. 1(e), a node SiN dielectric process may then be used, as in eDRAM techniques, to fill the trench with the capacitor dielectric, i.e., node fill, which may comprise SiN or other oxide material layer. Thus, as shown in FIG. 1(e), the DT resist and optional BSG hardmask layers are first stripped, and a node process implemented to deposit the decap dielectric material layer 32 such as a nitride material (e.g., SiN), oxynitride, or oxide material (e.g., $HfO_2$, $AlO_2$) that conforms to the bottom and sidewalls of the decap trench 26. In the embodiment described herein, a SiN node dielectric is deposited to a thickness of approximately 40 Å or greater. It is understood that the decap dielectric layer thickness may vary depending upon the capacitance value, dielectric film material, trench depth, trench area, and other design considerations. For example, the depth of the trench may be reduced at a reduced cost, by depositing a high-epsilon (K) dielectric. For example, $HfO_2$ has 5× the dielectric constant of the POR oxynitride that is used in eDRAM designs. If it is desired to have equivalent capacitance, the DT etch may be simply reduced to ⅕ the depth thereby making a 0.4 μm–0.5 μm deep trench), for example.

Then, as shown in FIG. 1(f), a highly doped N+ polysilicon is deposited in the trench 26 and then recessed in the trench to form the decap structure inner electrode 35. Particularly, the deposited N+ polysilicon material 35 is deposited within the trench 26 and then a chemical mechanical polish (CMP) step is applied to remove the formed node SiN laying over the STI and Pad SiN regions adjacent the trench. The N+ polysilicon fill (polyfill) 35 is then recessed within the trench so that a surface thereof is at the Si active region surface 33. The recessing of the N+ polysilicon within the decap trench 26 is performed using a reactive ion etch process, for example, with the Pad SiN utilized as a polish stop. Finally, after recessing the polyfill, as depicted in FIG. 1(g), the POR Pad film (Pad SiN) is stripped, for example by an (HF-based) nitride deglaze step followed by a hot phosphoric acid step to etch off the pad SiN. A pad oxide may remain if a pad stack was provided.

In the embodiment shown in FIG. 1(g), the DT decap implements a logic NW doping for the outer electrode 45. Thus, an N-well implant is provided by: forming a resist mask layer on the wafer, and, exposing and opening up the area in which the N-well implant is to be received. An ion implantation technique well known in the art is used to provide the N-well dopant species, e.g., phosphorus, P, to a targeted depth below the STI level, using energies of up to 1 MeV. Since the projected range (Rp) of the logic N-well (NW) is usually 1 mm or less, at least half the trench sidewall would be butting against P-type silicon. However, this scenario is actually good for obtaining high capacitance if the trench fill is positively biased (e.g., the N-well 45 would be held at ground) as an N-type inversion layer would be created in the P-type silicon. Since the N-doping level of the outer electrode is "light" (e.g., doping on the order of $1\times10^{17}$–$1\times10^{18}$/cm$^3$), and if the biasing of the outer plate is at ground, a large depletion region would be created in the NW field. This would require an NW—NW space of about 3 μm or, providing an isolation P-well around decaps as would be fabricated using known techniques.

Figure 1I:
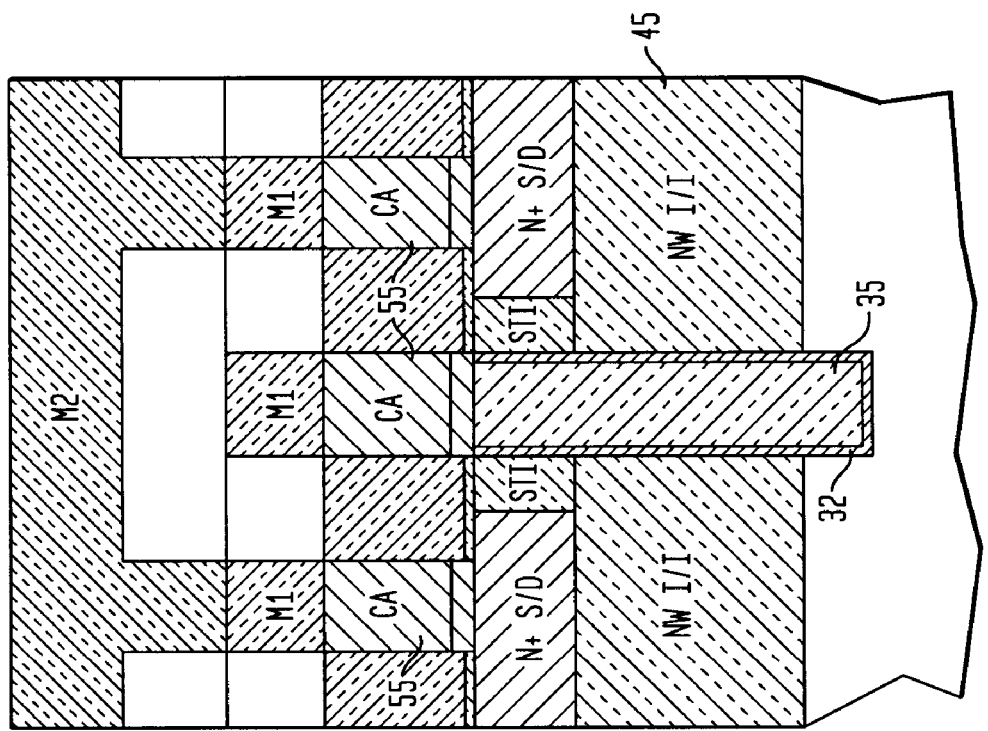
Figure 1H:
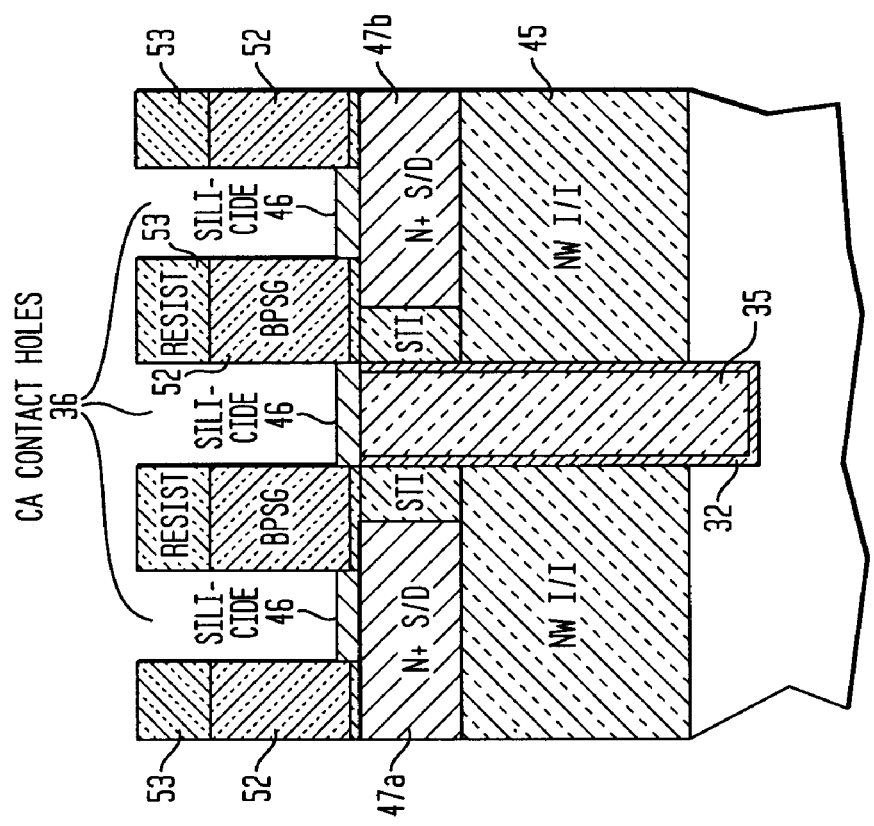

Referring now to FIGS. 1(h) and 1(i), the formed outer electrode (N-well) 45 and inner electrode (polyfill) 35 of the DT decap need to be connected to the metal layers to be subsequently formed. As shown in FIG. 1(h), using regular CMOS device processing, N+ source or drain regions 47a, 47b, e.g., for NFETs, may be formed using ion implantation (I/I) techniques in the active Si (Rx) layer 20. First, a resist layer is deposited, patterned, exposed and etched to form contact openings above the N+ source or drain contact regions 47a, 47b, and above the inner decap electrode 35. Then, an anneal process is performed to form the silicide contact using any metal that is capable of reacting with silicon to form a metal silicide. Examples of such metals include, but are not limited to: Ti, Ta, W, Co, Ni, Pt, Pd and alloys thereof. Particularly, a metal such as cobalt or nickel is deposited to the exposed silicon, and then an anneal process is performed to form the metal silicide regions, e.g., cobalt silicide or nickel silicide regions 46. A thin layer of nitride e.g., 500 Å thick, is then deposited above the exposed N+ source or drain regions and silicide regions. A deposition of a BPSG layer 52 is then conducted, patterned with a resist, and etched to open up contact areas 36 within the BPSG layer. The nitride layer above the silicide is etched, stopping on the silicide, so that only the silicide is exposed for the contact areas 36. FIG. 1(i) illustrates the resulting structure formed after the process of depositing contacts 55 to the inner decap electrode (to bias the polyfill inner electrode 35) as well as on the N+S/D diffusions adjacent to the trench decap (to bias the outer electrode 45). Particularly, using well known techniques, a contact material, typically a metal such as Tungsten, is deposited in the etched contact areas 36 in the BPSG layer above the formed silicide contacts to form the wire level contacts 55 ("plugs"). As the diffusions and top of the trench is silicided, the connection to the decap has a very low resistance since there is no buried strap feature used in this process (unlike eDRAM where the connection to the trench capacitor is through a N+ polysilicon buried strap). Interlevel and intralevel dielectrics and metal layers M1, M2, formed of Tungsten, Aluminum or Copper are then wired to the plugs 55 using conventional MOL and BEOL processing to contact respectively, the inner electrode 35 and outer electrodes 45 respectively of the decap 10.

In accordance with the first embodiment described herein with respect to FIGS. 1(a)–1(i), the only additional costs beyond the POR cost is cost of the additional mask needed to form the decap trench and the cost of performing the associated process steps of opening the DT mask open etch, the DT RIE step, the node process and the N+ polyfill deposition, CMP and recess steps.

Because the N-well formed is lightly doped, under certain bias conditions, a depletion region may form that affects the performance of the device. For example, if the N-well (forming the outer decap electrode) is at ground and the inner decap electrode (trench) is at a positive voltage, a depletion region forms that may affect another device, e.g., PFET area nearby, because of the depletion formed in the N-well. Rather than enforcing a ground rule, which would increase the device area, the solution in accordance with the second embodiment is now described. In this second embodiment, the sidewalls of the trench decaps are doped which provides more flexibility in placing decaps within a circuit. In this scenario, it is envisioned that the N-well can be biased at Vdd and the trench is at ground voltage. In this configuration, then N-wells can be merged together and one can place p-FETs in these Vdd-biased N-wells. Thus, a substantial reduction in decap area would result as compared to the structure described in accordance with the first embodiment.

Figure 2F:
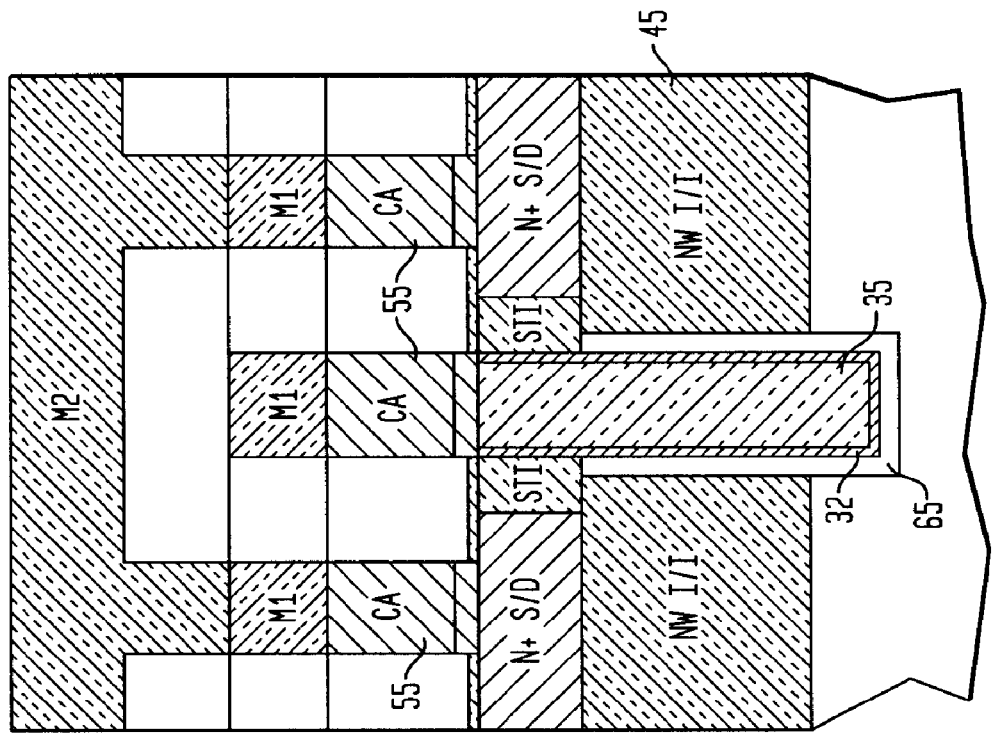
Figure 2E:
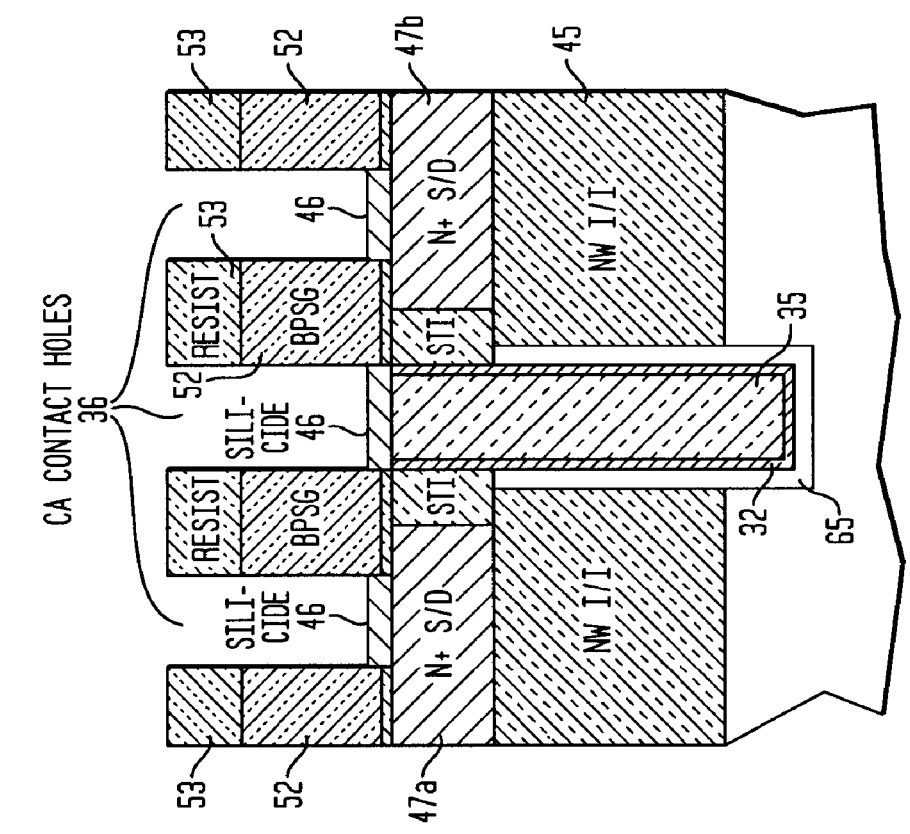

Thus, after the trench has been lithographically defined and etched as shown in process steps described herein with respect to FIGS. 1(a)–1(d) are performed, as shown in FIG. 2(a)(i)–2(a)(iii), there are several ways that a thin, heavily-doped N-type diffusion layer may be provided in the "shallow" trench decaps. One method of doping the sidewalls of the trench is to perform an angled implant of dopant, e.g., P or As. For example, as shown in FIG. 2(a)(i), dopant ions 60 may be implanted in the trench sidewalls 27 at an angle of incidence of, for example, 5 degrees or less angle from normal incidence, depending on the depth of the trench. A second method, as shown in FIG. 2(a)(ii), utilizes a gas-phase doping process whereby the open DT trench 26 is exposed to high concentration P or As gases 61. A third method, as shown in FIG. 2(a)(iii) is to simply fill the trenches with a doped gas 62, e.g., ASG (arsenic silicate glass) or PSG (phosphorus silicate glass) material layers, and perform an anneal, i.e., conduct a short high temperature outdiffusion step to outdiffuse the dopant from the silicate glass into the Si substrate. In each of the methods described, the highly doped N-type trench diffusion layer 65 (outdiffused plate) shown in FIGS. 2(a)(i)–2(a)(iii) are formed to a thickness of approximately 500 Å of less. Since the active Si diffusion islands are protected with pad SiN, one could avoid many of the processes that are part of the buried plate process presently used in eDRAM. These steps include: (1) a resist fill of the trench, (2) a chemical downstream etch (CDE) of the resist to 1 μm below the Si surface, (3) an oxide etch to remove the doped oxide from the upper region of the DT, (4) a wet clean of the resist, and, (5) an oxide capping layer. Chosen methods for providing the outdiffused plate, according to the second embodiment, is the implant or gas phase doping procedure as these methods are the least costly. Continuing, as shown in steps depicted in FIGS. 2(b) through 2(f), the N-well (decap outer electrode) is formed by ion implantation, and more particularly, the same exact process steps as described herein with respect to corresponding FIGS. 1(e) to FIG. 1(h) are performed to result in a trench decap structure 10, except for the presence of the outdiffused plate 65. The presence of the high dopant outdiffuse plate 65 prevents depletion into the substrate, i.e., thus reducing the device footprint.

In accordance with the second embodiment described herein with respect to FIGS. 2(a)–2(f), the only additional costs beyond the POR cost is cost of the additional mask needed to form the decap trench and the cost of performing the associated process steps of opening the DT mask open etch, the DT RIE step, the node process and the N+ polyfill deposition, CMP and recess steps and, the outdiffusion process steps which range depending upon the process step implemented.

The approaches described herein, provide a very simple increase in decoupling capacitance available for logic based processing and provides a simple well isolation for improved n+/p+ space with no extract process cost. This synergy coupled with the low added process cost and growing need for on chip decoupling capacitance makes this approach very attractive for 9SF and 10SF applications and beyond.

Figure 3I:
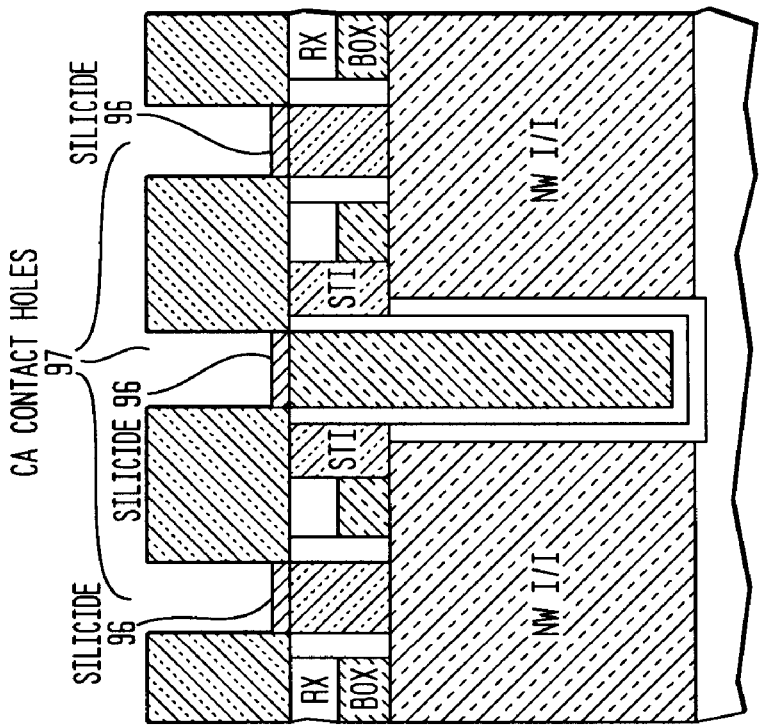
Figure 3H:
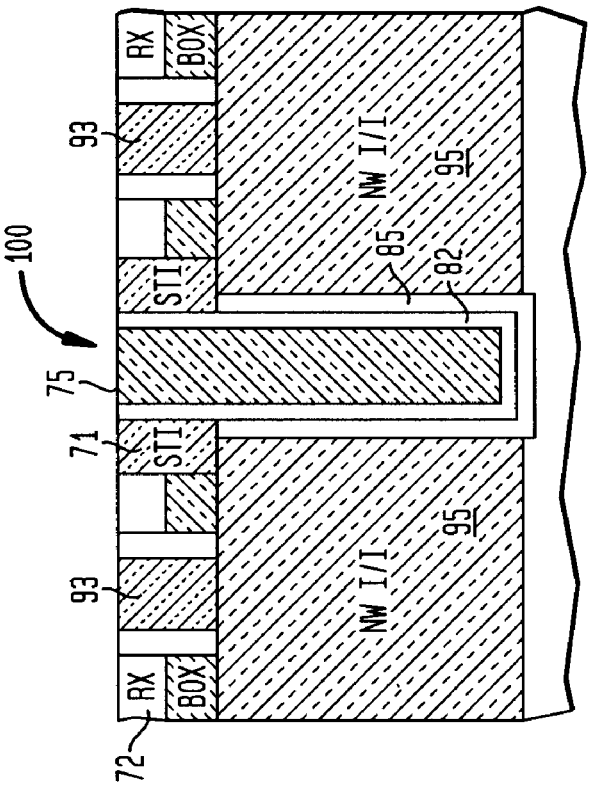
Figure 3J:
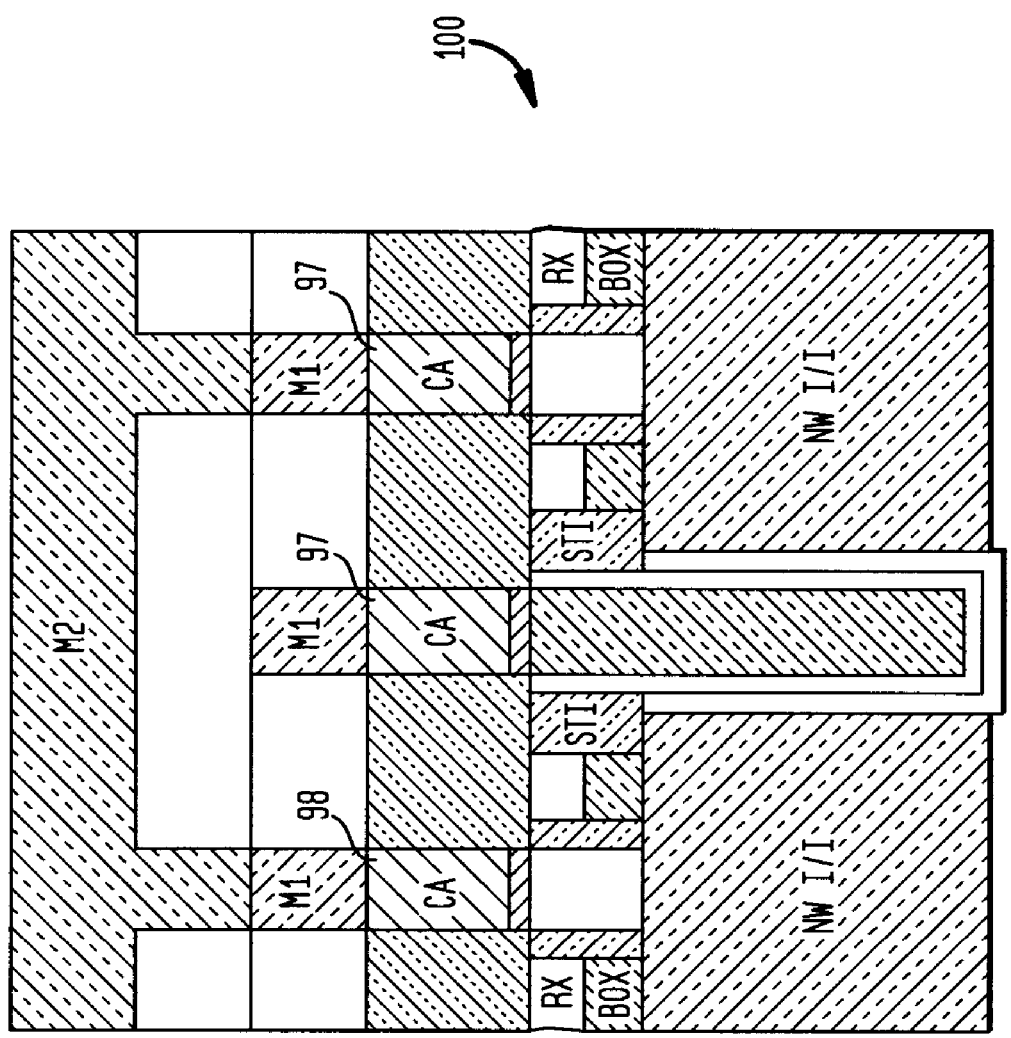

The low-cost decoupling capacitor according to further embodiments of the invention is now described herein with respect to FIGS. 3 and 4. In the third embodiment, the trench decaps are made at a lower cost, exhibit higher frequency response while lowering the overall leakage of a decap design and lowering the area set aside for decaps and, are integrated into an silicon-on-insulator (SOI) designs. There are two distinct "low-cost" trench decap structures and process variations described: a first variation described herein with respect to FIGS. 3(a)–3(j) depicts a process flow where the trench decap design is quickly and seamlessly integrated into an existing SOI technology process. The process calls for an additional two (2) masks: a DT mask and a block-level N-well mask such that the outer plate of the trench decap can be contacted through existing substrate contacts for SOI (e.g., doped poly contacts). In the second variation process described herein with respect to FIGS. 4(a)–4(j), a different trench decap process and structure is described whereby metal contacts, such as Tungsten (W), or other metal materials are used to contact the outer plate of the trench decap. This second unique structure may provide a faster capacitive decoupling response since the Tungsten (W) resistance is significantly lower than doped substrate contact polysilicon. This second process also calls for the same aforementioned masks, the DT mask and the block-level N-well mask. The two processes share the common physical structure in that a decap trench of, approximately 2 μm–3 μm deep, is processed. As the decap trench is to be formed to a depth of about 2 μm–3 μm deep, the number of processes to fabricate the trench decap is greatly reduced compared to conventional eDRAM capacitors.

In the decap structure according to the third embodiment, described herein with respect to FIGS. 3(a)–3(j), the trench process is performed after the STI regions are physically patterned and filled. That is, this process is polar opposite to "eDRAM" processing where the capacitors are formed prior to STI.

The process flow described with respect to FIG. 3(a) illustrates the resulting structure of the STI process of record and particularly the formed STI regions 71a–71c extending through to a BOX (buried oxide layer) layer 70. The STI regions are first patterned and formed by etching through: a Pad nitride or nitride stack 74, the thin active silicon layer 72 and through the thin BOX layer 70. Etching of the BOX layer 70 is an optional step, and the STI may be formed to the top of the BOX layer, i.e., etched through to the bottom of the silicon layer 72. The width of the STI region may be about 0.3 Im to 0.6 Im, however, the depth may range up to 500 Å to 1000 Å, but may range up to a depth up to 2500 Å. Then, the STI is filled with an oxide, e.g., LP-TEOS, and HDP oxide, as described herein. After the POR STI module, the DT lithography, mask open, and Si RIE process is conducted. That is, as described herein with respect to FIGS. 1 and 2 herein, a resist mask 78 and/or an optional hardmask (e.g., BSG) is applied, and patterned to expose the STI region 71b and, a deep trench etch is performed through the STI opening in the mask 78 to a depth of 2 μm to 3 μm as shown in FIG. 3(c). Subsequent to the formation of the decap trench 76, the Si substrate sidewalls and bottom of the trench 76 are doped to form an outdiffused portion of the outer electrode of the capacitor. This step implements an outdiffusion process and results in the formation of an outdiffused plate 85 forming a highly doped portion of the capacitor outer electrode beneath the buried oxide layer 70. The trench sidewall doping can be accomplished by either of the following methods: 1) an N+ type dopant 60 angled ion implantation as shown in FIG. 3(d)(i); 2) an N+ gas-phase doping 61 of N type dopant, e.g., P or As dopants, as shown in FIG. 3(d)(ii); and, 3) an N+ doped glass deposition 62 and anneal as shown in FIG. 3(d)(iii). It is understood that, in alternative embodiments, the process steps for forming the outdiffused plate may be omitted. Whether the outdiffused plate 85 is formed or not, the next step is the process of forming the thin capacitor dielectric layer 82—that is, an oxide or a nitride, such as SiN, that conforms to the trench sidewalls and bottom. Thus, as shown in FIG. 3(e) and as described in detail herein with respect to FIGS. 1 and 2, a resist strip is first performed and then the node process is performed. Next, in FIG. 3(f) and as described herein with respect to FIGS. 1 and 2, a highly N doped polysilicon fill is performed to construct the decap inner electrode 75. FIG. 3(f) shows the N+ poly fill 75 in the decap trench 76. It is understood that, as part of this process, a CMP is performed and a top portion of the polyfill is then recessed to the top surface of the active silicon layer 72.

Then, as shown in FIG. 3(g), after the trench process, the process proceeds to form a Bitline contact adjacent to the trench, which comprises steps of punching through an adjacent STI (or insulator) area(s) 71a, 71c and stopping the etch on the bottom substrate, i.e., it only has to etch the thickness of the active silicon layer 72 and the BOX layer 70. According to processes of record for BI module, the etched area(s) 83 is(are) typically filled with intrinsic (undoped) Si 93 as shown in FIG. 3(g) and a CMP is performed to planarize and recess each of the filled i-Si regions to the surface of the active Si layer 72. It is understood that the steps for recessing the N+ polysilicon fill forming decap inner electrode 75 and the i-Si may be performed in the same process step. Then, as shown in FIG. 3(h), an N-well implant step to form decap outer electrode 95 is performed in the manner such as described herein with respect to FIGS. 1 and 2. The substrate contacts (plugs) adjacent to the trench decap are to be used to bias the outer electrode of the trench decap. Since the substrate contacts polysilicon plugs 93 are undoped, for the substrate contacts within the trench decap macro, these would necessarily need to be doped N-type. This can be accomplished by N+ doping the Source/Drain regions in the active Silicon layer 72 by ion implantation later in the process. However, within the N-well ion implant mask (not shown), the implants for the substrate contacts (plugs) may be further doped if the N+ source/drain diffusions are insufficient to dope the entire poly plug. If necessary, N-type ion implants may then be targeted to depths below the active Si layer 72, e.g., corresponding to the middle of the BOX, for example, to guarantee that the whole substrate contact is doped. This ion implantation may be performed during the following N-well ion implantation step or thereafter. Thus, to connect the trenches and make them amenable to voltage biasing, the deep N-well implant—like the one used in eDRAM processing, is performed. Doses in the range of $10^{13}/cm^2$–$10^{14}/cm^2$, for example, should provide enough conduction to bias the outer plate (e.g., 100 Ω/sq–1000 Ω/sq). The projected range of the N-well implant would only need to be one that is on the order of the SOI and BOX thickness (e.g., about 2000 Å depth). If Phosphorus (P) is used as the N-well dopant, accelerating energies of 200 keV may be sufficient. Since the N-well mask is unique to the trench decap macro, other than N-type dopants may be implanted into the substrate contacts 93 to make them more conductive. Thus, as shown in the FIG. 3(h), after an oxide deglaze, pad SiN etch process, and N-well ion implantation steps, the resulting structure 100 illustrates N+ poly plugs 93 contacting the N-well implant 95 which is connected to the outdiffused portion 85 of the outer DT capacitor electrode.

After the N-well process, FIGS. 3(i) and 3(j) illustrate the remaining processes to create the trench decap uses the POR MOL module. In FIG. 3(i), the substrate contacts 93 and decap inner electrode poly 75 are silicided 96 and contacted by plugs 98 of a metal material, e.g., such as Tungsten (W). The process includes the formation of respective contact holes 97 implementing a dielectric film deposition (e.g., a nitride or BPSG) and a contact hole lithography patterning and etch as shown in FIG. 3(i). M1 and M2 metallurgy is then used to follow and finish up the macro as shown in FIG. 3(j).

What is described in FIGS. 3(a)–3(j) depict the easiest method in that trench decaps 100 can be integrated into existing SOI processing technology.

Figure 4B:
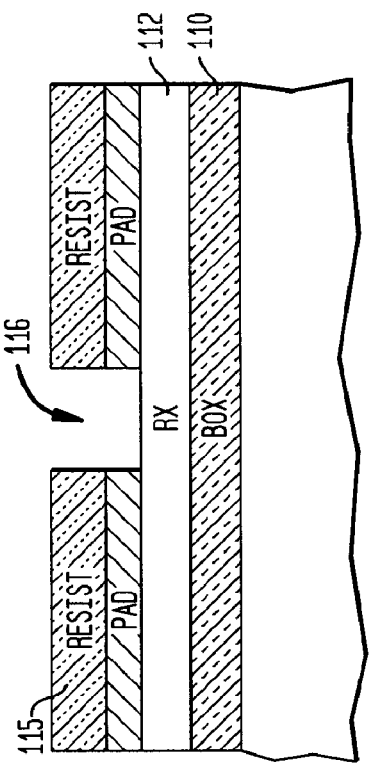
Figure 4C:
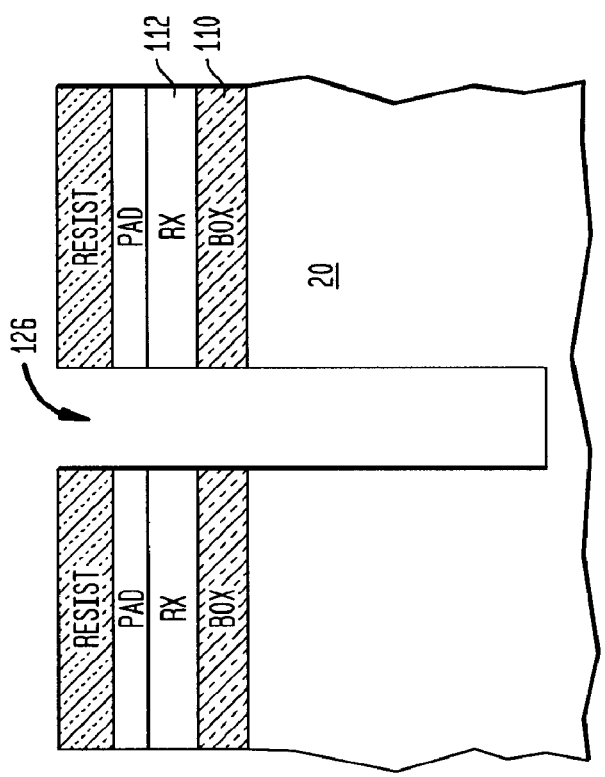
Figure 4A:
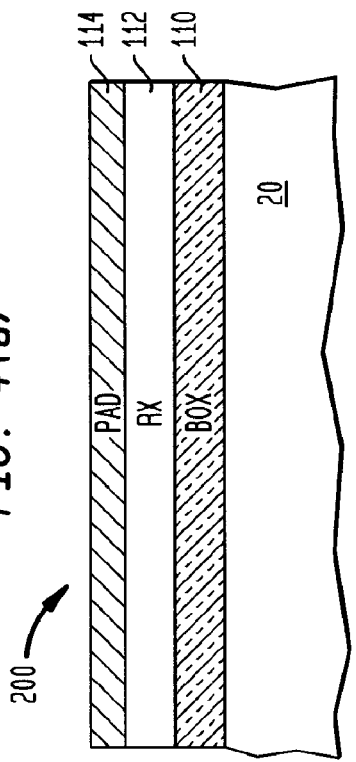
Figure 4F:
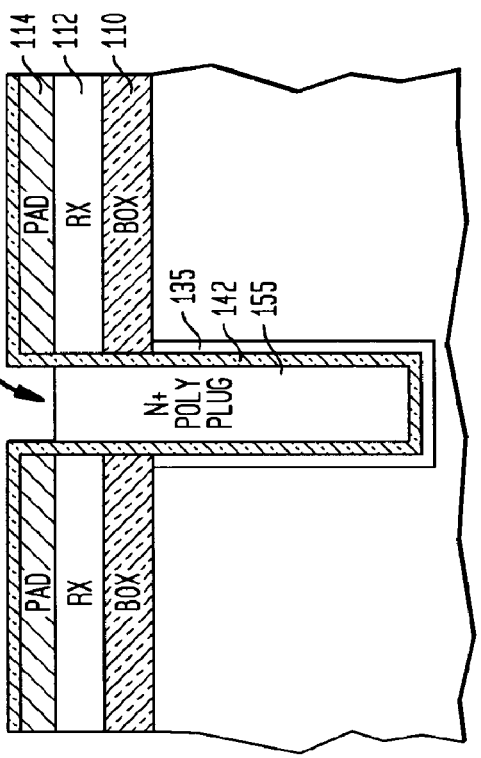
Figure 4E:
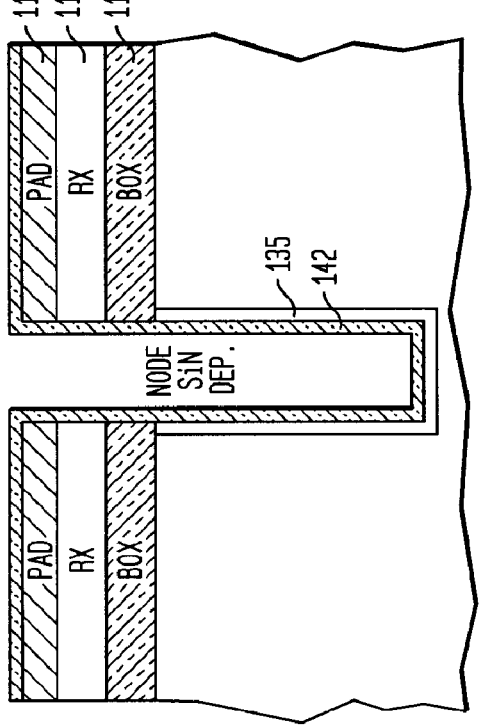

In a further embodiment, described herein with respect to FIGS. 4(a)–4(j), the deep trench decap 200 can be processed before the STI (standard) processing, i.e., does not require trench formation through STI. In the embodiment depicted in FIG. 4(a), there is formed by process of record a thin active Silicon layer 112 atop a BOX layer 110 formed atop a Si-containing substrate 20. As shown in FIG. 4(a), a Pad nitride layer or nitride stack 114 is deposited above the thin active Si layer 112. Then, as shown in FIG. 4(b)–4(c), a trench lithography, mask open, and Si RIE process is conducted. That is, as described herein with respect to FIGS. 1 and 2 herein, a resist mask 115 and/or an optional hardmask (e.g., BSG), is patterned to expose a region 116 for forming a deep trench etch. Subsequent to the formation of the decap opening 116, an etch process is performed through the opening in the mask to form a trench 126 that extends through the PAD layer 114, thin active silicon layer 112 and through the thin BOX layer 110 to a depth of about 2 Im to 3 Im as shown in FIG. 4(c). Subsequent to the formation of the decap trench 126, the Si substrate sidewalls and bottom of the trench are doped to form an outdiffused portion of the outer electrode of the capacitor. This step results in the formation of an outdiffused plate 135 beneath the buried oxide layer 110 forming a highly doped portion of the capacitor outer electrode and implements an outdiffusion process. The trench sidewall doping can be accomplished by either of the following methods: 1) an N+ type dopant 60 angled ion implantation as shown in FIG. 4(d)(i); 2) an N+ gas-phase doping 61 of N type dopant, e.g., P or As dopants, as shown in FIG. 4(d)(ii); and, 3) an N+ doped glass deposition 62 and anneal as shown in FIG. 4(d)(iii). It is understood that, in alternative embodiments, the process steps for forming the outdiffused plate may be omitted. Whether the outdiffused plate 135 is formed or not, the next step is the process for forming the thin capacitor dielectric layer 142—that is, an oxide or a nitride, such as SiN, that conforms to the trench sidewalls and bottom. Thus, as shown in FIG. 4(e) and as described in detail herein with respect to FIGS. 1 and 2, any remaining resist strip is first performed and then the node process is performed. Next, as shown in FIG. 4(f) and as described herein with respect to FIGS. 1 and 2, a highly N+ doped polysilicon fill is performed to construct the decap inner electrode 155. FIG. 4(f) shows the N+ poly fill 155 in the decap trench 126. It is understood that, as part of this process, a CMP is performed and a top portion of the polyfill is then recessed to the top surface of the active silicon layer 112.

Figure 4G:
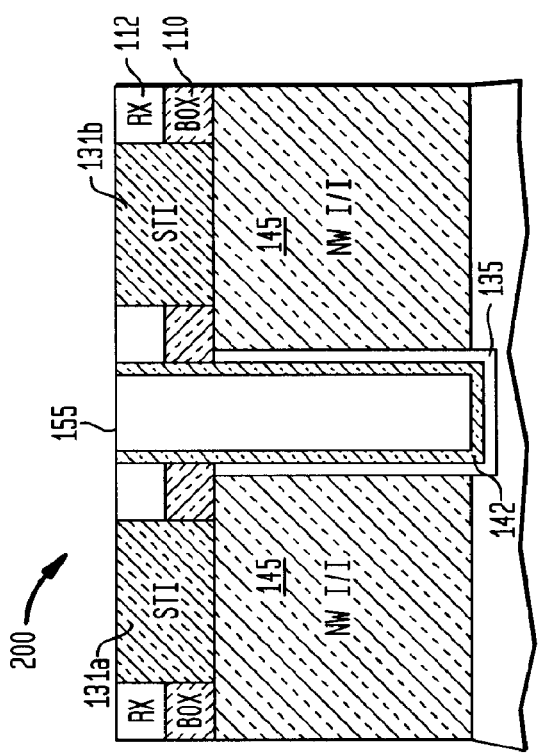
Figure 4J:
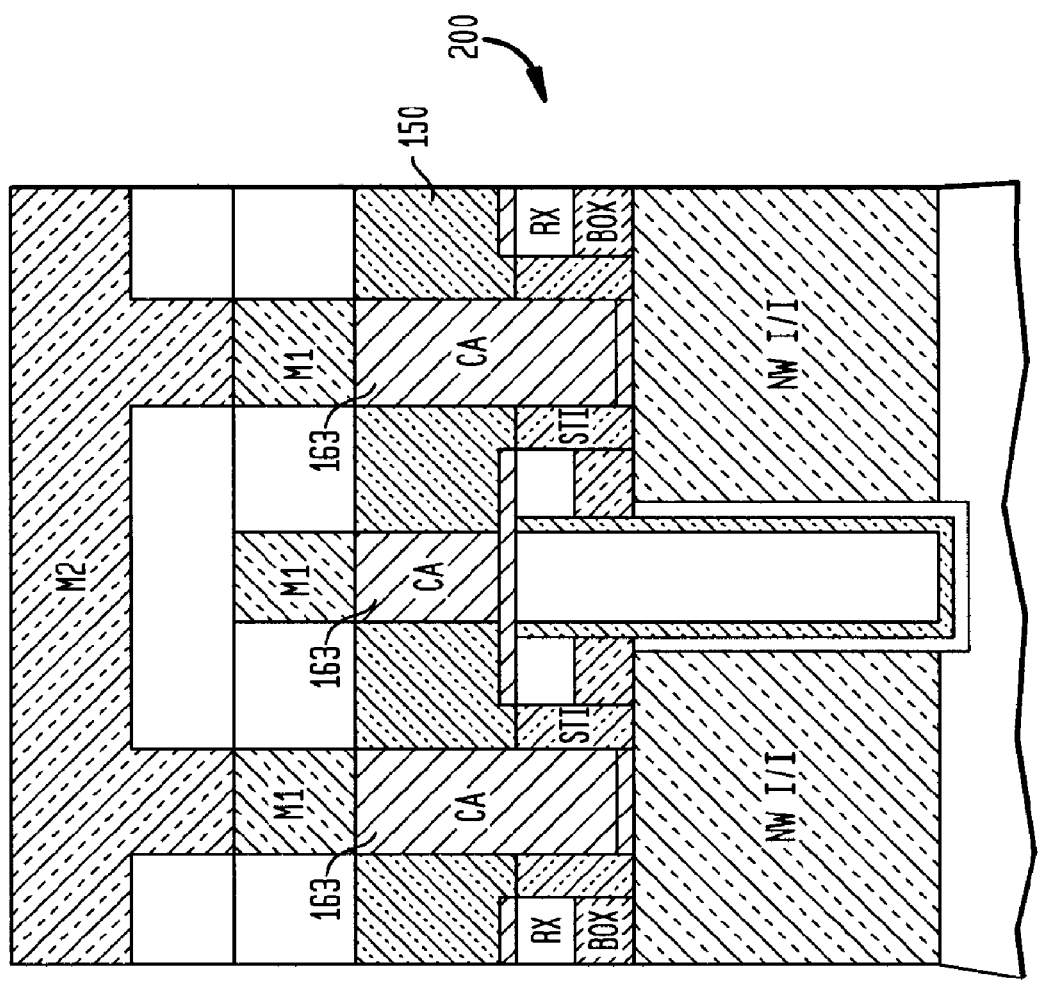

In the next steps in the process flow, shown in FIG. 4(g), a typical STI module process is performed to form two STI structures 131a, 131b located on either side of the decap inner electrode 155. In the STI module process, each STI region is first patterned and formed by etching through a Pad nitride or nitride stack 114, the thin active silicon layer 112 and through the thin BOX layer 110. Etching of the BOX layer 110 is an optional step, and the STI may be formed at the top of the BOX layer, i.e., etched through to the bottom of the silicon layer 112. The width of each STI region may be about 0.3 Im to 0.6 Im, however, the depth may range up to 500 Å to 1000 Å, but may range up to a depth up to 2500 Å. Each STI opening is filled with an oxide, e.g., LP-TEOS, and HDP oxide, as described herein. As shown in FIG. 4(g), after the POR STI module and a pad Nitride strip step (not shown), a deep N-well implant step similar to the one used in eDRAM processing, is performed to form the N-well implant regions 145 under each STI region. Then, as shown in FIG. 4(h), the Bitline lithography, mask open, and Si RIE process is conducted to form respective openings 141a, 141b at each formed STI structure 131a, 131b respectively. The etched openings 141a, 141b are used to form the metal substrate poly contacts to the decap outer electrode. In FIG. 4(i), the resist 148 used to etch the STI regions in FIG. 4(h) is removed (stripped) and a silicide layer, e.g., a metal silicide, is formed above the entire region of the trench capacitor and the adjacent active silicon regions 112a, 112b. Silicide is additionally formed at the substrate contact regions (openings) 141a, 141b. Then, a dielectric layer 150, e.g., an oxide, or BPSG, is deposited, planarized, lithography patterned and etched to open up the capacitor electrode contact holes 153 above the formed silicide regions 156. Then, in FIG. 4(j) all of the contact holes 153 are filled with Tungsten or like conductive material to contact the Si underneath the BOX. Then normal BEOL (back-end-of-the-line) and MOL processing is performed to connect the formed Tungsten plugs to M1, M2 metallurgy layers. Advantageously, with Tungsten metal contacts 163 formed as part of substrate contacts, the frequency response is higher than the decap structures created with the N+ polyfill contacts in the previous embodiment depicted in FIGS. 3(g)–3(j). It should be understood that it is possible to eliminate the N-well if there is enough thermal budget such that the outdiffused plate can reach the substrate N+ contact. Additionally, it has been shown that Phosphorus in high concentrations of Arsenic dopant will greatly accelerate the Phosphorus outdiffusion. An outer plate comprising of these two dopant materials (P and As) may be suitable to allow for the N-well elimination.

It should be understood that for some applications, the polarity of the electrodes in the decap devices in the embodiments described herein may be reversed, i.e., P-type dopants may be utilized in the process steps described, without much modification or undue experimentation.

Figure 5A:
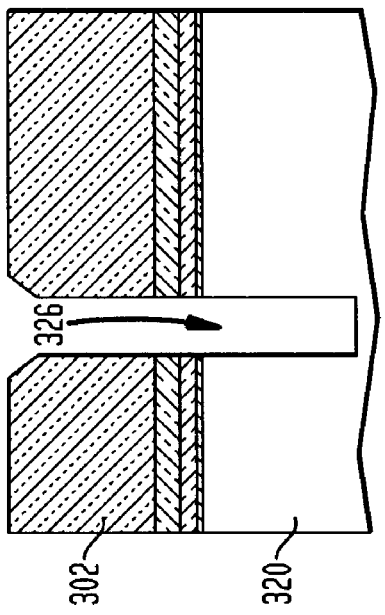
Figure 5B:
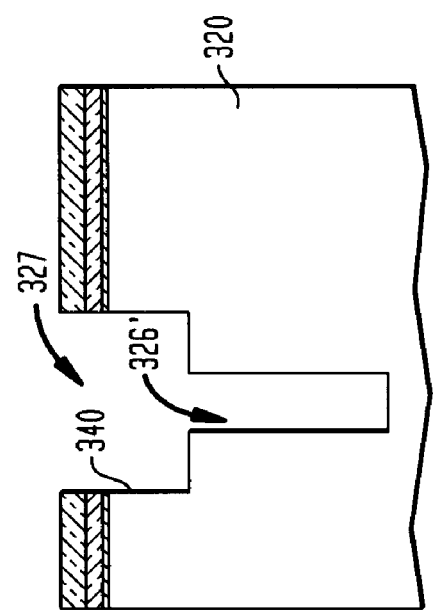
Figure 5C:
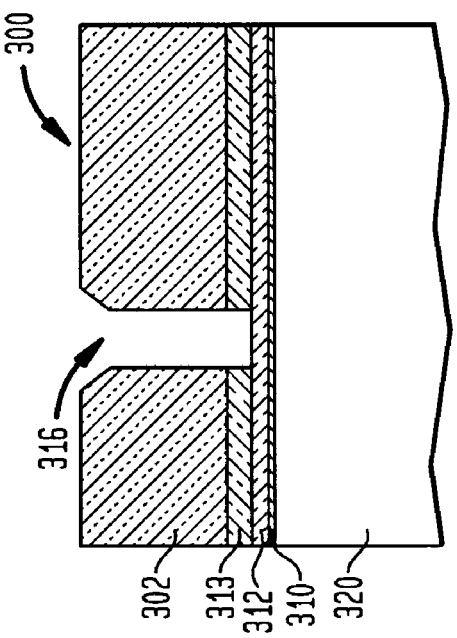
Figure 5D:
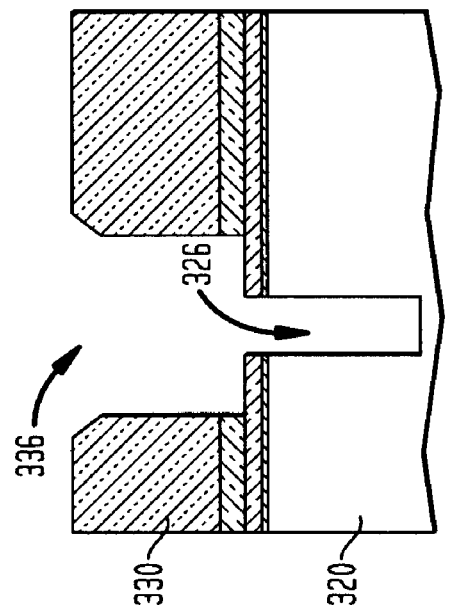

As a measure to further reduce costs, the decap 300 of the present invention is implemented in a base logic process consistent with and compatible with logic processing methods and tool set as now described with respect to FIGS. 5(a)–5(h). In the embodiment depicted in FIGS. 5(a)–5(h), the decap trench is formed in the same processing steps as the formation of the STI regions. That is, the only extra added steps is the patterning and developing a resist layer 302 having an opening 316 upon a formed hard mask oxide layer 313, a pad oxide layer 310 and/or pad nitride surface layer 312 formed above the Si substrate 320 as shown in FIG. 5(a), and then etching a shallow decap trench 326 into the Si layer e.g., below the surface as shown in FIG. 5(b). Then the layer of resist is stripped and the base processing for forming the STI region is performed. According to the STI base processing, a new mask is formed by patterning and developing a resist layer 330 including an opening 336 that is about the same width of the STI region to be formed as shown in FIG. 5(c). Then, a further etch process, such as a Reactive Ion Etch (RIE) is performed to etch the Si substrate 320 to form STI trench region 340. As a result of this processing, in the same STI etch step, the depth of decap trench is extended, i.e., more Si is being etched to a depth of about 2–3 μm to result in the decap trench structure 326' as depicted in FIG. 5(d). The trench structure shown in FIG. 5(d) is then filled with a HD plasma oxide 327 or like dielectric material and planarized. Depending upon a particular application, the resulting structure will form a decap for example, with the formation of an underlying N-well region 350 and provision of a highly doped N-band layer 355 as shown in the structure of FIG. 5(e)(1). Advantageously, the provision of N-band layer 355 effectively increases the decap capacitance, thus obviating the need for the formation of a heavily doped outdiffused plate as in the other embodiments described herein. Alternately, the structure may be used as an isolation region for isolating an N-well region 350 and a P-well region 360 shown in FIG. 5(e)(2). Further to the forming of decap 300 of the present embodiment, the only other additional cost to the base logic processing is the addition of a second mask 370 as shown in FIG. 5(f) which provides an opening 375 enabling a straight etch, e.g., RIE, to remove the HDP oxide present in the trench while leaving the HDP oxide portions 342, 343 of the formed STI. Once the HDP oxide is removed from the trench, the standard technology for forming the thin decap dielectric layer 382 is performed concurrently with a surface gate oxidation process, e.g., grown to a thickness ranging between 2.0 and 5.0 nm. Then, a standard gate polysilicon deposition process providing a conformal fill 385 of the decap trench is performed concurrent with base logic standard gate polysilicon deposition and the polyfill is doped with N+ material dopant (as described herein) to form the inner decap electrode. The resultant structure is shown in FIG. 5(g). Preferably, this implantation of N+ dopant is also part of the standard logic N+ source and drain implant procedure. Advantageously, depositing the same dielectric material, e.g., an oxide, nitride, oxynitride, etc. used for the decap dielectric 382 at the time logic gate dielectric is deposited, incurs no additional cost as this is part of standard base processing. Likewise, the polysilicon fill 385 is deposited at the same time logic gate polysilicon is deposited according to standard logic base processing thus, incurring no additional cost. Then, in a subsequent processing step shown in FIG. 5(h), the decap polysilicon fill layer is patterned and portions removed by etching the poly over the thin oxide regions and corresponding insulating spacers 395a, 395b are formed over the STI regions 342, 343 according to known techniques. Finally, active diffusion regions (e.g., source/drain implants) 390a, 390b, e.g., having implanted N+ material dopant materials are formed according to standard processing and concurrently dope the poly 385 that contact the N+ doped N-band and N-well regions which form the outer decap electrode.

FIG. 5(i) depicts a conceptual top view schematic of a resultant formed decap trenches 300 pointing downward into the silicon for about 2 μm–3 μm deep forming a high capacitance structure in a small area 400. It is understood that the amount of decoupling capacitance may be tailored according to number of trenches formed. For example, for a typical nitrided oxide dielectric of 2.2 nm in thickness, a trench that is 0.1 μm wide with a depth of 1.0 μm will result in approximately 25 fF/μm² of capacitance. Additionally depicted is the formed polysilicon 385, underlying N-well 350, active silicon region 398, and STI 340 regions separating the active silicon. It is understood that spacers separating the outer edges of the polysilicon layers as shown in FIG. 5(h) are omitted in FIG. 5(i). It is further understood that the process and resulting decap structure of the embodiment depicted in FIGS. 5(a)–5(h) may be formed in a substrate having an underlying BOX (buried oxide) layer, however, there would be no N-band and additionally, no need for well-to-well isolation with SOI structure having a buried oxide.

The embodiment of the invention depicted in FIGS. 5(a)–5(h) provides a very simple increase in decoupling capacitance available for logic based processing and provides a simple well isolation for improved N+/P+ with no extra process cost. This synergy coupled with the low added process cost and growing need for on chip decoupling capacitance makes the approach of the present invention very attractive for 65 nm node applications and beyond.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A decoupling capacitor (decap) structure formed in a semiconductor substrate having a trench insulator structure formed therein, said decap comprising:
   a capacitor trench formed in said trench insulator structure, said capacitor trench of less width than a width of said trench insulator structure and extending into said substrate, said capacitor trench having a capacitor dielectric layer lining the sidewalls and bottom of said capacitor trench;
   an inner decap electrode formed of a doped semiconductor material deposited in said capacitor trench; and
   an outer decap electrode comprising doped semiconductor material regions formed adjacent said capacitor trench beneath said trench insulator structure in said substrate;
   an active region of like conductivity as said doped semiconductor material regions formed adjacent said trench insulator structure and contacting said outer decap electrode; and
   a contact structure formed atop said inner decap electrode for electrically connecting said inner decap electrode to a first formed metal level and, another contact structure formed atop said active regions of like conductivity for electrically connecting said outer decap electrode to a second formed metal level.

2. The decap structure as claimed in claim 1, wherein said inner decap electrode comprises a doped polysilicon material filling said capacitor trench.

3. The decap structure as claimed in claim 2, wherein said outer decap electrode comprises a doped well structure of a same doping type as said doped polysilicon fill material.

4. The decap structure as claimed in claim 1, wherein said trench insulator includes an insulating material comprising one of: HDP oxide or LP-TEOS.

5. The decap structure as claimed in claim 1, wherein said capacitor dielectric material comprises one of an oxide or nitride.

6. The decap structure as claimed in claim 1, further comprising respective contact structures for connecting said inner decap electrode and outer decap electrode to one or more metal levels.

7. The decap structure as claimed in claim 6, further including doped semiconductor regions formed above said outer decap electrode and extending to a substrate surface adjacent remaining portions of said trench insulator structure on either side of said capacitor trench.

8. The decap structure as claimed in claim 7, farther comprising silicide contacts to connect a surface of said doped semiconductor regions and said inner capacitor electrode with respective contact structures.

9. The decap structure as claimed in claim 1, further comprising an outdiffuse plate comprising a doped semiconductor material formed adjacent said capacitor dielectric layer and connecting with said outer decap electrode beneath remaining portions of said trench insulator structure.

10. The decap structure as claimed in claim 9, wherein said out diffused plate material is formed by a diffusion process.

11. The decap structure as claimed in claim 10, wherein said diffusion process includes doping said sidewalls and bottom trench by ion implanting dopant material.

12. The decap structure as claimed in claim 10, wherein said out diffusion process includes doping said sidewalls and bottom trench by gas phase doping.

13. The decap structure as claimed in claim 10, wherein said out diffusion process includes doping said sidewalls and bottom trench by forming a doped glass layer prior to performing an anneal step.

14. The decap structure as claimed in claim 1, further comprising a buried insulator layer in said substrate, said capacitor trench extending to a depth below said buried insulator layer.

15. A decoupling capacitor (decap) structure formed in a semiconductor substrate having a trench insulator structure formed Therein, said decap comprising:
  a capacitor trench formed in said trench insulator structure, said capacitor trench of less width than a width of said trench insulator structure and extending into said substrate, said capacitor trench having a capacitor dielectric layer lining the sidewalls and bottom of said capacitor trench;
  an inner decap electrode formed of a doped semiconductor material deposited in said capacitor trench;
  an outer decap electrode comprising doped semiconductor material regions formed adjacent said capacitor trench beneath said trench insulator structure in said substrate; and,
  an outdiffuse plate comprising a doped semiconductor material formed adjacent said capacitor dielectric layer lining and connecting with said outer decap electrode beneath remaining portions of said trench insulator structure;
  an active region of like conductivity as said doped semiconductor material regions formed adjacent said trench insulator structure and contacting said outer decap electrode; and
  a contact structure formed atop said inner decap electrode for electrically connecting said inner decap electrode to a first formed metal level and, another contact structure formed atop said active regions of like conductivity for electrically connecting said outer decap electrode to a second formed metal level.

16. The decap structure as claimed in claim 15, further comprising a buried insulator layer in said substrate, said capacitor trench extending to a depth below said buried insulator layer.

* * * * *